US010734987B2

(12) United States Patent
Solomko et al.

(10) Patent No.: US 10,734,987 B2
(45) Date of Patent: Aug. 4, 2020

(54) RF SWITCH

(71) Applicant: Infineon Technologies AG, Neubiberg (DE)

(72) Inventors: Valentyn Solomko, Munich (DE); Carsten Ahrens, Regensburg (DE); Winfried Bakalski, Putzbrunn (DE); Andrea Cattaneo, Taufkirchen (DE); Bernd Schleicher, Ebersberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/506,343

(22) Filed: Jul. 9, 2019

(65) Prior Publication Data
US 2020/0028504 A1      Jan. 23, 2020

(30) Foreign Application Priority Data
Jul. 17, 2018    (DE) .................... 10 2018 211 896

(51) Int. Cl.
*H03K 17/687*      (2006.01)
*H03K 17/06*       (2006.01)

(52) U.S. Cl.
CPC ... *H03K 17/063* (2013.01); *H03K 2217/0054* (2013.01)

(58) Field of Classification Search
CPC .............. H03K 17/063; H03K 2217/0054
USPC ............................................. 327/427
See application file for complete search history.

(56) References Cited

U.S. PATENT DOCUMENTS

| 8,786,002 | B2 | 7/2014 | Kondo et al. |
| 9,240,770 | B2 | 1/2016 | Kerr et al. |
| 9,461,609 | B2 | 10/2016 | Madan et al. |
| 9,973,155 | B2 | 5/2018 | Levesque |
| 2011/0316062 | A1* | 12/2011 | Kondo ............... H01L 29/93 257/312 |
| 2018/0159530 | A1 | 6/2018 | Englekirk |

* cited by examiner

*Primary Examiner* — Metasebia T Retebo
(74) *Attorney, Agent, or Firm* — Slater Matsil, LLP

(57) ABSTRACT

A radio frequency, RF, switch device includes a plurality of switch units, wherein the switch units are coupled in series between a first series terminal and a second series terminal to establish a switchable RF path; and a plurality of ballasting capacitor units, wherein each ballasting capacitor unit is coupled in parallel to a respective switch unit, to provide a selectable capacitance in parallel to a signal path of the respective switch unit, wherein each ballasting capacitor unit includes at least one ballasting capacitor switch element to switch the capacitance of the ballasting capacitor unit between a first capacitance value and a second capacitance value, wherein the second capacitance value is larger than the first capacitance value.

25 Claims, 16 Drawing Sheets

RF SWITCH

This application claims the benefit of German Application No. 102018211896.5, filed on Jul. 17, 2018, which application is hereby incorporated herein by reference.

TECHNICAL FIELD

The present document refers to a radio frequency, RF, switch device and to an RF switch arrangement. The document also refers to a method for operating an RF switch.

BACKGROUND

A radio frequency, RF, switch, e.g., for a wireless antenna, may comprise a plurality of switches coupled in series. An RF peak voltage (which may reach 80 V in some cases) can lead to the creation of an unwanted conductive path between the terminals of the switches and other elements, such as ground metal lines. In particular, the switches closer to the high-voltage terminal tend to experience a higher voltage drop than the switches at the low-voltage terminal. In general terms, the more the stacked switches and/or the larger the parasitic capacitance of each switch to the ground, the more the effect is pronounced. Therefore, among the switches, unequal voltage drops are caused.

Each switch (which may be a transistor, such as a metal-oxide-semiconductor field-effect transistor, MOSFET) has in general a low voltage-handling capability, and, therefore, different voltage drops at different switches are unwanted. In an attempt to equalize the voltage drops at the different switches of the series, a technique has been proposed, according to which capacitors are connected in parallel to the switches. Capacitors with high capacitance have been associated to switches closer to the high-voltage terminal, while capacitors with low capacitance have been associated to switches closer to the low-voltage terminal.

This technique defines a unique direction in the series and is only advantageous for the applications in which it is determined a priori which of the terminals will be the high-voltage terminal of the series. In applications for which, for example, the series is operated at the opposite voltage, the capacitors will have the unwanted effect of increasing the inequalities between the voltage drops.

SUMMARY

There is provided a radio frequency, RF, switch device, wherein the RF switch device comprises: a plurality of switch units, wherein the switch units are coupled in series between a first series terminal and a second series terminal to establish a switchable RF path; and a plurality of ballasting capacitor units, wherein each ballasting capacitor unit is coupled in parallel to a respective switch unit, to provide a selectable capacitance in parallel to a signal path of the respective switch unit, wherein each ballasting capacitor unit comprises at least one ballasting capacitor switch element configured to switch the capacitance of the ballasting capacitor unit between: a first capacitance value; and a second capacitance value, wherein the second capacitance value is larger than the first capacitance value.

According to an aspect, the first capacitance value of a first ballasting capacitor unit of the plurality of ballasting capacitor units may be different from the first capacitance value of a second ballasting capacitor unit of the plurality of ballasting capacitor units.

According to an aspect, the second capacitance value of the first ballasting capacitor unit may be different from the second capacitance value of the second ballasting capacitor unit.

According to an aspect, the RF switch device may comprise: a first group of consecutive ballasting capacitor units such that the first capacitance values increase along one predetermined direction, while the second capacitance values decrease along the predetermined direction; and a second group of consecutive ballasting capacitor units such that the first capacitance values decrease along the predetermined direction, while the second capacitance values increase along the predetermined direction, wherein the first group precedes the second group along the predetermined direction and the first and second group together form at least the majority of the plurality of switch units of the switch device.

According to an aspect, at least one of the plurality of ballasting capacitor units may comprise: at least one first capacitor element providing the first capacitance value; and at least one second capacitor element providing the second capacitance value, wherein the at least one ballasting capacitor switch element is configured to alternatively switch between: the at least one first capacitor element to select the first capacitance value; and the at least one second capacitor element to select the second capacitance value.

According to an aspect, at least one of the plurality of ballasting capacitor units may comprise: at least one permanent capacitor element, wherein the at least one permanent capacitor element is permanently in parallel to the signal path of the respective switch unit; at least one selectable capacitor element, wherein the at least one selectable capacitor element is selectable to be in parallel to the signal path of the respective switch unit, so that the second capacitance value is selectable by activating the at least one selectable capacitor element, wherein the at least one ballasting capacitor switch element is configured to select: the first capacitance value by deactivating the at least one selectable capacitor element; and the second capacitance value by activating the at least one selectable capacitor element.

According to an aspect: the at least one ballasting capacitor switch includes a first ballasting capacitor switch and a second ballasting capacitor switch; and the at least one selectable capacitor element includes: a first selectable capacitor element with a first terminal coupled with a first terminal of the respective switch unit via the first ballasting capacitor switch and a second selectable capacitor element with a first terminal coupled with a second terminal of the respective switch unit via the second ballasting capacitor switch; a capacitance selection line configured to control the respective switch unit, wherein the capacitance selection line is coupled to a second terminal of the first selectable capacitor element and to a second terminal of the second selectable capacitor element.

According to an aspect, the ballasting capacitor units are configured so as to have a total series capacitance between 1 fF and 100 fF (femtofarads), and/or wherein at least one of the second capacitance values is less than 1 pF.

According to an aspect, at least one of the ballasting capacitor units is formed on a silicon-on-insulator, SOI, wafer.

According to an aspect, the first capacitance values along the signal path or along the ballasting capacitor units or along the predetermined direction may follow a quadratic function at least over a majority of half of the ballasting capacitor units.

According to an aspect, the second capacitance values along the signal path or along the ballasting capacitor units or along the predetermined direction may follow a quadratic function or another function which is between a cubic function and a proportional function at least over a majority of half of the ballasting capacitor units.

According to an aspect, the first capacitance values and the second capacitance values of at least the majority of the ballasting capacitor units may be arranged so as to permit a control which defines at least one of: a first configuration mode, in which the capacitance values of at least the majority of the selected capacitances of the ballasting capacitor units decrease along a predetermined direction; a second configuration mode, in which the capacitance values of at least the majority of the selected capacitances of the ballasting capacitor units increase along the predetermined direction of the signal path; a third configuration mode, in which: the capacitance values of at least the majority of the selected capacitances of a first group of ballasting capacitor units decrease along the predetermined direction; and the capacitance values of at least the majority of the selected capacitances of a second group of ballasting capacitor units increase along the predetermined direction, wherein the first group precedes the second group along the predetermined direction; and a fourth configuration mode, in which: the capacitance values of at least the majority of the selected capacitances of a first group of ballasting capacitor units increase along the predetermined direction; and the capacitance values of at least the majority of the selected capacitances of a second group of ballasting capacitor units decrease along the predetermined direction, wherein the first group precedes the second group along the predetermined direction.

According to an aspect, the RF switch device may comprises: a first capacitance selection line, wherein the first capacitance selection line is configured to control at least the majority of the ballasting capacitor switch elements of a first group of the ballasting capacitor units; and a second capacitance selection line, wherein the second capacitance selection line is configured to control at least the majority of the ballasting capacitor switch elements of a second group of the ballasting capacitor units, wherein the first group precedes the second group along a predetermined direction, so that the RF switch device is configured to exert a control such that at least one of the following conditions is satisfied: in a first configuration mode: the first capacitance selection line selects the second capacitance values for at least the majority of the ballasting capacitors of the first group; and the second capacitance selection line selects the first capacitance values for at least the majority of the ballasting capacitors of the second group; so that the capacitance values of at least the majority of the selected capacitances of the ballasting capacitor units decrease along the predetermined direction; in a second configuration mode: the first capacitance selection line selects the first capacitance values for at least the majority of the ballasting capacitors of the first group; and the second capacitance selection line selects the second capacitance values for at least the majority of the ballasting capacitors of the second group; so that the capacitance values of at least the majority of the selected capacitances of the ballasting capacitor units increase along the predetermined direction; in a third configuration mode: the first capacitance selection line selects the second capacitance values for at least the majority of the ballasting capacitors of the first group; and the second capacitance selection line selects the second capacitance values for at least the majority of the ballasting capacitors of the second group; so that the capacitance values of at least the majority of the selected capacitances of the ballasting capacitor units decrease for a first portion and increase for a second portion, wherein the first portion precedes the second portion along the predetermined direction; in a fourth configuration mode: the first capacitance selection line selects the first capacitance values for at least the majority of the ballasting capacitors of the first group; and the second capacitance selection line selects the first capacitance values for at least the majority of the ballasting capacitors of the second group; so that the capacitance values of at least the majority of the selected capacitances of the ballasting capacitor units increase for a first portion and decrease for a second portion, wherein the first portion precedes the second portion along the predetermined direction.

According to an aspect, the RF switch device comprises: a first capacitance selection line, wherein the first capacitance selection line is configured to control a first arrangement of capacitor elements associated to at least the majority of the ballasting capacitor units, wherein the capacitances of at least the majority of the capacitor elements of the first arrangement decrease along a predetermined direction of the RF path; and a second capacitance selection line, wherein the second capacitance selection line is configured to control a second arrangement of capacitor elements associated to at least the majority of the ballasting capacitor units, wherein the capacitances of at least the majority of the capacitor elements of the second arrangement decrease along the predetermined direction of the RF path, wherein the capacitor elements of the first arrangement are selectable and the capacitor elements of the second arrangement are selectable, wherein the RF switch device is configured to exert a control such that at least one of the following conditions is satisfied: in a first configuration mode, the first capacitance selection line selects the capacitance values of the first arrangement, so that the capacitance values of the second arrangement are deactivated; and in a second configuration mode, the second capacitance selection line selects the capacitance values of the second arrangement, so that the capacitance values of the first arrangement are deactivated.

According to an aspect, the RF switch may be configured to determine, between the first series terminal and the second series terminal, the terminal experiencing a higher peak voltage, so as to select the capacitance value of a determined ballasting capacitor unit to be higher than the capacitance value of a subsequent ballasting capacitor unit, wherein the determined ballasting capacitor unit is closer to the voltage terminal at higher voltage than the subsequent ballasting capacitor unit.

According to an aspect, the RF switch is configured to determine, between the first series terminal and/or the second series terminal, the terminal experiencing a higher peak voltage, so as to select capacitances of the ballasting capacitor units such that ballasting capacitance values are monotonically or strictly monotonically decreasing when proceeding along the switch units from the series terminal experiencing the higher peak voltage towards the other series terminal.

According to an aspect, the RF switch device is configured to detect at least one of a gate induced drain leakage, GIDL, current and a GIDL voltage associated to at least one of the plurality of switch units, or a gate leakage current or gate leakage voltage or another leakage current or another leakage voltage, so as select the capacitance values of the ballasting capacitors based on the detected leakage current or leakage voltage.

According to an aspect, the RF switch device is configured to use at least one of the GIDL current and GIDL voltage to detect at least one of a peak in the voltage or to detect the terminal at higher voltage between the first series terminal or the second series terminal.

According to an aspect, the RF may comprise a resistor unit in parallel to at least one of the plurality of switch units, wherein the resistor unit is selectable between: a first resistance value; and a second resistance value, wherein the second resistance value is larger than the first resistance value, wherein the RF switch device is configured to select at least one of: the first resistance value in correspondence with the selection of the first capacitance value; the second resistance value in correspondence with the selection of the second capacitance value; and the first resistance value in correspondence with the selection of the first capacitance value.

According to an aspect, the RF switch device comprises a resistor unit in parallel to at least one of the plurality of switch units, wherein the resistor unit is modifiable according to at least a voltage level at the first series terminal and a second series terminal.

According to an aspect, the capacitance values may be chosen in order to obtain an equal distribution of voltages across the switching elements, within a tolerance of +/−20%, for a case in which a peak voltage at the first series terminal is larger than a peak voltage at the second series terminal in a first configuration state of the ballasting units, and to obtain an equal distribution of voltages across the switching elements, within a tolerance of +/−20%, for a case in which a peak voltage at the first series terminal is smaller than a peak voltage at the second series terminal in a second configuration state of the ballasting units.

According to an aspect, there is provided a radio frequency, RF, arrangement, comprising: an antenna comprising a feed point and a tuning point; a first radio frequency switch device according to any of the preceding aspects, wherein the first radio frequency switch device is coupled between a feed line and the feed point; and a second radio frequency switch device according to any of the preceding aspects, wherein the second radio frequency switch device is coupled between the tuning point and a ground potential conductor in series with an impedance element, wherein the first radio frequency switch device is configured to have a different distribution of ballasting capacitances along the plurality of switch units.

According to an aspect, there is provided a method for operating an RF switch comprising a series coupling of switch elements, wherein the method comprises adjusting a distribution of capacitance values of ballasting capacitances, which are coupled in parallel to the switch elements, along the series of switch elements in dependence on a configuration information or in dependence on levels [e.g. peak levels] present at terminals of the switch elements.

DETAILED DESCRIPTION OF ILLUSTRATIVE EMBODIMENTS

Figure 1:
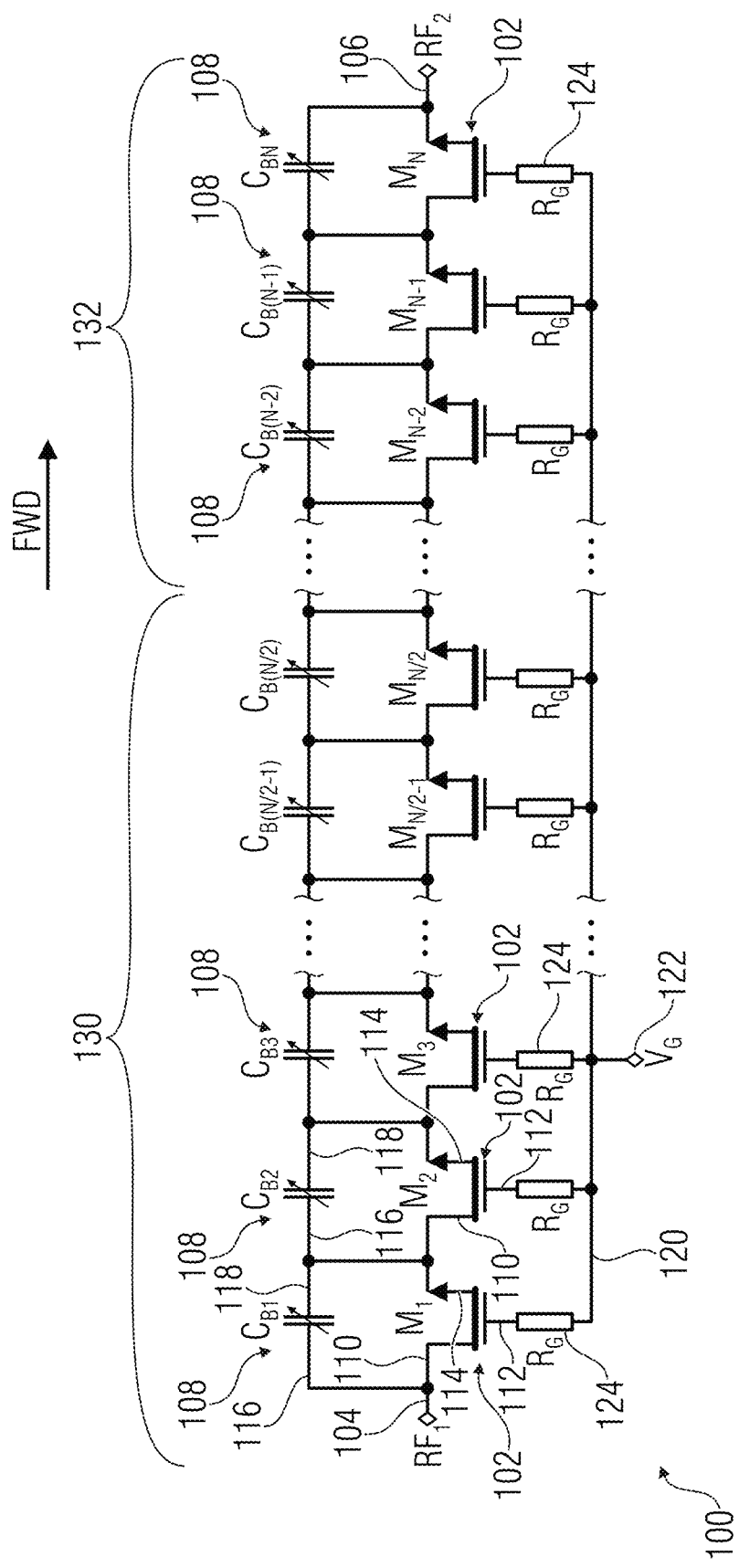
FIG. 1 shows an RF switch device.

FIG. 1 shows a radio frequency, RF, switch device 100 according to examples. The switch device boo may comprise a plurality of switch units 102 ($M_1, M_2, \ldots, M_N$) with a first series terminal 104 ($RF_1$) and a second series terminal 106 ($RF_2$), to establish a switchable RF path. The switch units 102 ($M_1$-$M_N$) may be coupled in series (e.g., in a stacked structure) between the first series terminal 104 ($RF_1$) and the second series terminal 106 ($RF_2$), so as to establish the switchable RF path (e.g., between $RF_1$ and $RF_2$). The RF switch device boo may comprise a plurality of ballasting capacitor units 108 ($C_{B1}$-$C_{BN}$). Each ballasting capacitor unit 108 may be coupled in parallel to a respective switch unit 102 ($M_i$). Each ballasting capacitor unit 108 provides a selectable capacitance ($C_{Bi}$) in parallel to the signal path of the respective switch unit 102 ($M_i$). The ballasting capacitor unit 108 may provide a capacitance ($C_{Bi}$) which may be between: a first capacitance value; and a second capacitance value, which is larger than the first capacitance value.

Therefore, it is possible to choose between different capacitance values ($C_{Bi}$) to be associated to each respective switch unit 102 ($M_i$). For those switch units 102 which are closer to the high-voltage terminal, the second (larger) capacitance value may therefore be selected. For those switch units 102 which are closer to the low-voltage terminal, the first capacitance value may be selected. Hence, the capacitance values adapt to the direction of the RF voltage and permit to properly compensate the unwanted voltage variations.

Each switch unit 102 may have a first signal terminal 110, a second signal terminal 114, and a control terminal 112, for example.

At least one of (or all) the switch units 102 ($M_1$-$M_N$) may comprise (or be) a MOSFET, with a drain terminal 110 (first signal terminal), a gate terminal 112 (control terminal), and a source terminal 114 (second signal terminal). The signal path may be between the drain terminal 110 and the source terminal 114, under the control exerted by the gate terminal 112. The MOSFET 102 may, according to the voltage at the gate terminal 114, selectively permit or inhibit the passages of charges between the drawing terminal 110 and the source terminal 114, hence causing a switching effect. In examples, the source terminal 114 of a MOSFET 102 (e.g., $M_1$) may be connected to the drain terminal 110 of a subsequent MOSFET 102 (e.g., $M_2$). A first terminal 116 of a ballasting capacitor unit 108 may be connected to the drain terminal 110 of a MOSFET 102 and a second terminal 118 of a ballasting capacitor unit 108 may be connected to the source terminal 114 of the MOSFET 102. The second terminal 118 of a ballasting capacitor 108 may be connected to a first terminal 116 of a subsequent ballasting capacitor 108.

At least some of the switch units 102 ($M_1$-$M_N$) may be controlled via at least a switch unit control line 120 which may be, in examples, subjected to a voltage $V_G$. The voltage $V_G$ may be biased by an external element connected to a control input terminal 122. The external element, which controls the control input terminal 122, may be or may be controlled by, for example, a microcontroller, a digital signal processor, DSP, etc. The external element may therefore be an element which controls an application for radio communications (e.g., for receiving/transmitting wireless signals). Between the switch unit control line 120 and the gate terminal 112 of each MOSFET 102, a resistor 124 ($R_G$) may be interposed.

In examples, when the RF switch device 100 is to be activated (ON) to permit a passage of current along the signal path, a positive voltage $V_G$ may be input so as to control each gate terminal 112 to permit the passage of charges between the drain terminal 110 and the source terminal 114, hence permitting the passage of current between the first and second series terminals 104 and 106. When it is intended to deactivate (OFF) the RF switch device 100, the voltage $V_G$ may be reduced to the point that the gate of each MOSFET 102 does not permit the passage of charges between the drain terminal 110 and the source terminal 114, and no current flows between the first and second series terminals 104 and 106 of the RF device 100. The presence of non-uniform voltages at different switch units 102 is alleviated by the selection of the most appropriate capacitances ($C_{BFi}$) at the ballasting capacitor units 108.

Figure 2:
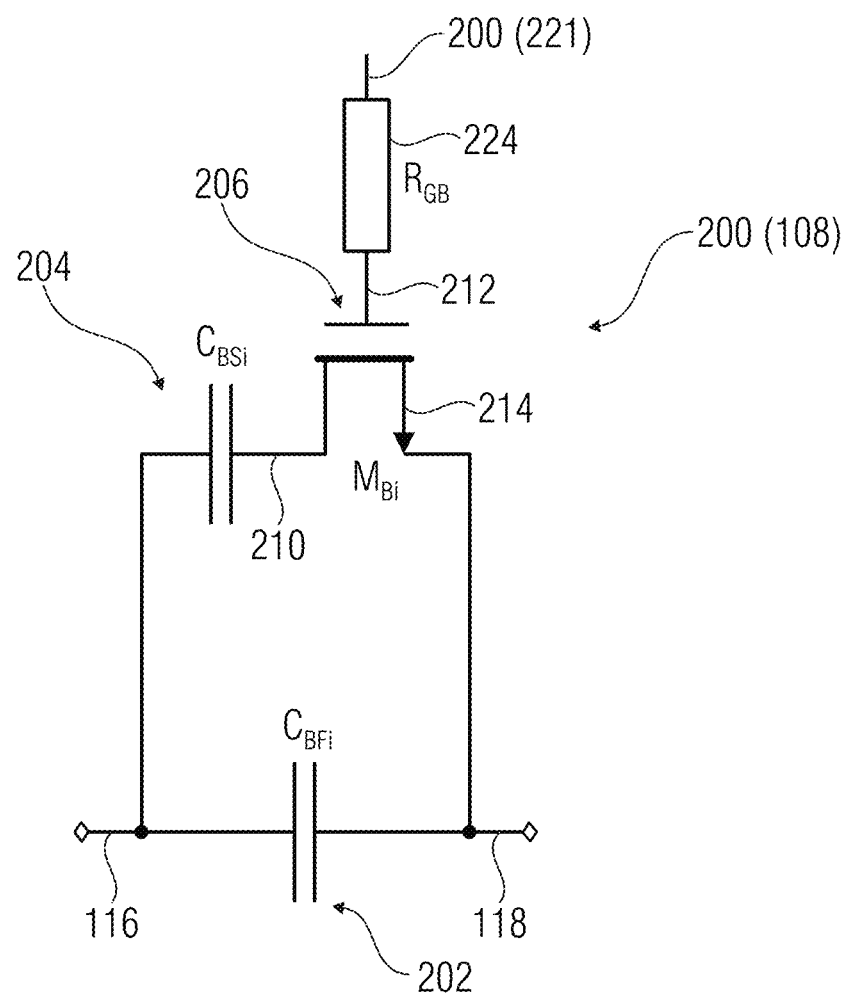
FIG. 2 shows a particular of the RF switch device of FIG. 1.

Several examples of ballasting capacitor units may be provided. One example is the ballasting capacitor unit 200 (108) of FIG. 2. This ballasting capacitor unit 200 is switchable (selectable) between: a first capacitance value ($C_{BFi}$); and a second capacitance value ($C_{BFi}+C_{BSi}>C_{BFi}$).

In examples, the ballasting capacitor unit 200 may comprise: at least one permanent capacitor element 202 ($C_{BFi}$) which may be permanently in parallel to the signal path of the respective switch unit 102 ($M_i$); and at least one selectable capacitor element 204 ($C_{BFi}$) which may be selectable to be in parallel to the signal path of the respective switch unit 102 ($M_i$), so that the second capacitance value ($C_{BFi}+C_{BSi}$) is selected by activating the at least one selectable capacitor element 204.

The ballasting capacitor unit 200 (108) may comprise a ballasting capacitor switch element 206 ($M_{Bi}$) which may actuate a selection between the first capacitance value ($C_{BFi}$) and the second capacitance value ($C_{BFi}+C_{BSi}$), e.g., by activating or deactivating the selectable capacitor element 204. The ballasting capacitor switch element 206 may therefore control the capacitance of the ballasting capacitor unit 200 (108) by connecting and disconnecting in parallel an additional capacitor element (which provides the capacitance $C_{BSi}$) in addition to the permanent capacitor element 202 (which provides the capacitance $C_{BFi}$).

At least one of (or all) the ballasting capacitor switch units 206 ($M_i$) may be a MOSFET, for example, with a drain terminal 210, a gate terminal 212, and a source terminal 214. The selection of the selectable capacitor element 204 ($C_{BFi}$) may be obtained by permitting the passage of charges between the drain terminal 210 and the source terminal 214, under a control exerted by the gate terminal 212. The MOSFET 206 ($M_{Bi}$) may, according to the voltage at the gate terminal 214, selectively permit or inhibit the passages of charges between the drawing terminal 210 and the source terminal 214, hence causing a switching effect which connects the selectable capacitor element 204 in parallel to the permanent capacitor element 202, so as to increase the capacitance at the terminals of the switch unit 102. In examples, the MOSFET 206 ($M_{Bi}$) may have the same characteristics of the MOSFET 102. The MOSFET 206 may be differently sized, and, for example, it may have smaller channel width.

Each ballasting capacitor switch element 206 ($M_{Bi}$) may be controlled (e.g., at the gate terminal 212) by a capacitance selection line 220 (221), which may be subjected to a voltage which forces the MOSFET 206 ($M_{Bi}$) to be selectively ON or OFF. Between the capacitance selection line 220 and each gate terminal 212, a resistor 224 ($R_{GB}$) may be interposed.

In examples, the capacitance selection line 220 is not unique and does not control the total amount of the ballasting capacitor units 200 (108) of the RF switch device 100: it is possible, for example, that different groups of ballasting capacitor units are connected to different capacitance selection lines 220 and 221, so as to selectively switch different ballasting capacitor switch units 206. In examples, it is possible to distinguish between different groups of switch units 102 on the basis of the different capacitance selection lines which activate/deactivate the different selectable capacitor elements 204. In some examples, a first group 130 of switch units (which may, for example, include the first N/2 switch units $M_1 \ldots M_{N/2}$) may be distinguished from a second group 132 of switch units (which may, for example, include the second N/2 switch units $M_{(1/2)+1} \ldots M_N$). Therefore, the ballasting capacitor switch units 206 ($M_1 \ldots M_{N/2}$) of the first group 130 may be selected or deselected together, while the ballasting capacitor switch units 206 ($M_{(N/2)+1} \ldots M_N$) of the second group 132 may be selected or deselected together. The control of the first group 130 may be independent of the control of the second group 132. The first group 130 may precede the second group 132 in a predetermined direction FWD (e.g., a direction from the first series terminal 104 to the second series terminal 106).

In examples, it is possible to use a ballasting capacitor unit different from the ballasting capacitor unit 200. For example, it is possible to use a capacitance tuner, where the switch units 102 are coupled to the terminals 110 and 114 via other capacitors. Other examples are discussed in subsequent examples.

In examples, different ballasting capacitor units 108 may have different first or second capacitance values. The first capacitance value (e.g., $C_{BF1}$) of a first ballasting capacitor unit 108 may be different from the first capacitance value (e.g., $C_{BF2}$) of a second ballasting capacitor unit 108. This effect may be obtained, in the example of FIG. 2, by using selectable capacitor elements 204 with different capacitances. For example, it is possible to configure the capacitors so that $C_{BF1}<C_{BF2}$, or $C_{BF(N-1)}>C_{BFN}$. The second capacitance value (e.g., $C_{BF1}+C_{BS1}$) of the first ballasting capacitor unit 108 may be different from the second capacitance value (e.g., $C_{BF2}+C_{BS2}$) of a second ballasting capacitor unit 108. This effect may be obtained, in the example of FIG. 2, by using selectable capacitor elements 204 which, when coupled in parallel to the respective permanent capacitor elements 202, cause capacitances to be different between the first ballasting capacitor unit 108 and the second ballasting capacitor unit 108. For example, it is possible to configure the capacitors so that $C_{BF1}+C_{BS1}>C_{BF2}+C_{BS2}$, or $C_{BR(N-1)}+C_{BS(N-1)}<C_{BFN}+C_{BSN}$.

By choosing appropriate first and second capacitance values for different ballasting capacitor units 108 and/or by selectively controlling the ballasting capacitor switch elements 206, it is possible to obtain ballasting capacitances which adequately increase the uniformity of the voltages at different switch units 102.

For example, it is possible to choose the capacitances (e.g., $C_{Bi}$) of the ballasting capacitor units so as to be descending from the high RF voltage terminal (104 or 106, whatever it is) to the low RF voltage terminal. In case an opposite polarity is requested, it is possible to choose the capacitances so as to be descending from the new high RF voltage terminal towards the low RF voltage terminal. With respect to the traditional techniques, it is therefore possible to use the same hardware for applications requiring different directions.

Figure 3:
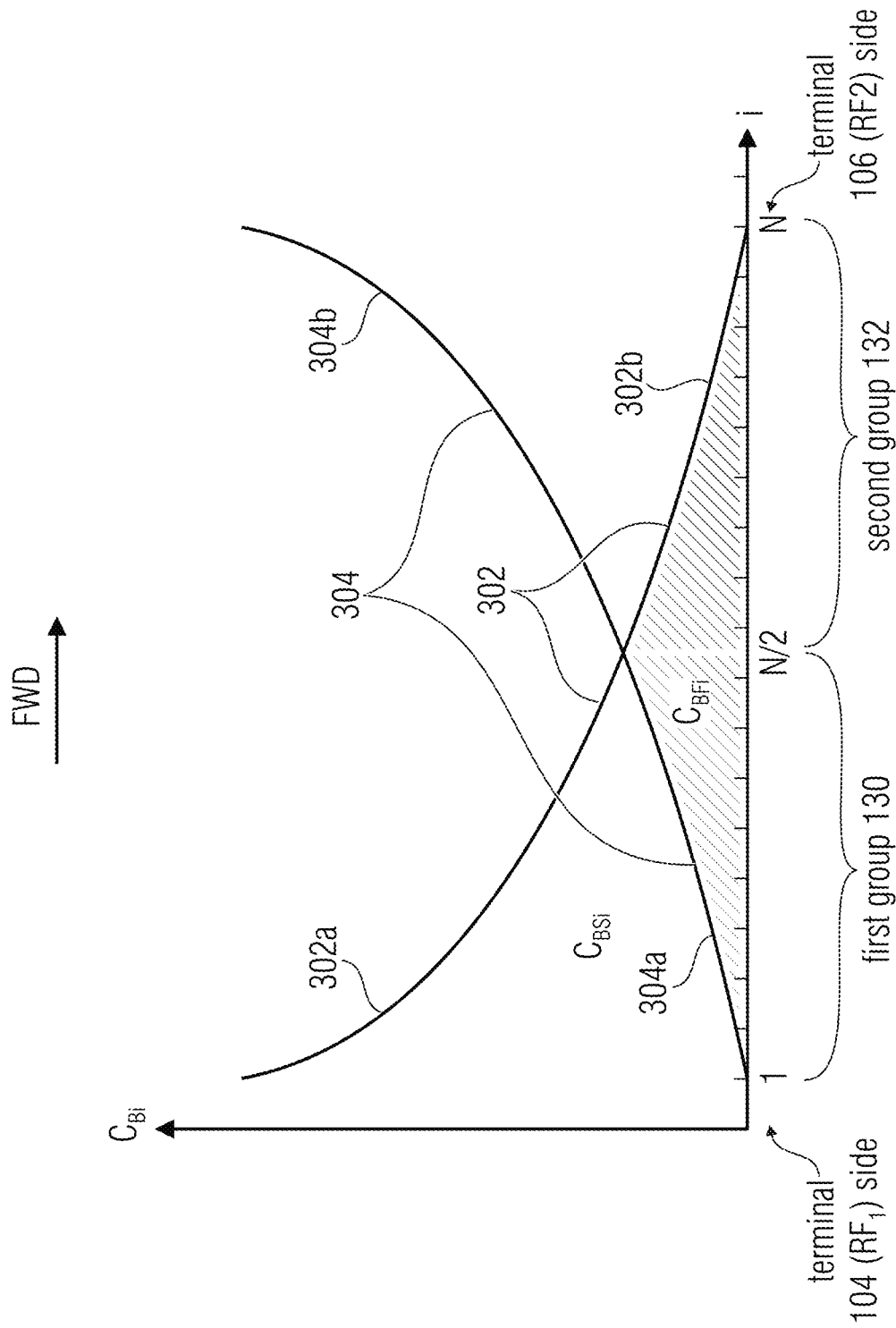
FIGS. 3 and 4 show diagrams representing capacitances of an RF switch device.

An example is provided in FIG. 3. The abscissa is associated to the different switch units 102 ($M_i=M_1 \ldots M_N$). The ordinate is associated to the capacitance $C_{Bi}$ in parallel to each switch unit 102 (e.g., the capacitance at the terminals 110 and 114 of each MOSFET 102).

Figure 4:
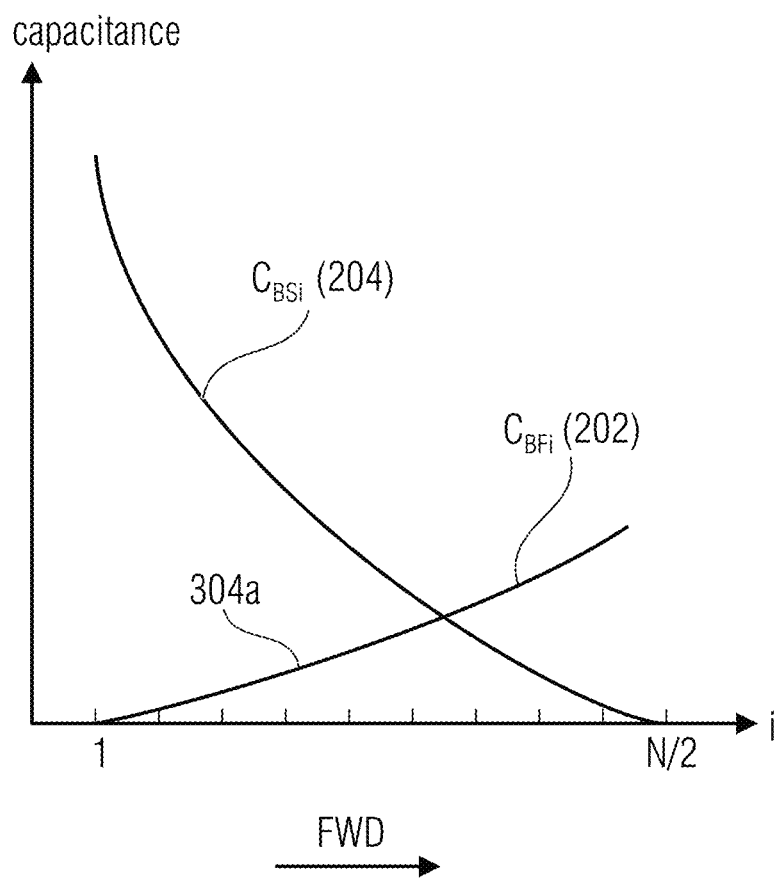

FIG. 4 refers to the same example of FIG. 3, but shows (in ordinate) the values that the capacitances ($C_{BFi}$) of the permanent capacitor element 202 ($C_{BFi}$) and the capacitances ($C_{BSi}$) of the selectable capacitor element 204 may have for obtaining the values of FIG. 3. FIG. 4 does not show the capacitances for (N/2)+1 ... N, which would be symmetrical with respect to a vertical axis at N/2. In examples, at least one of the following relationships may be satisfied:

$$C_{BFi}=C_{BF(N-i)}, C_{BSi}=C_{BS(N-i)}, C_{Bi}=C_{B(N-i)}$$

As can be understood from FIGS. 3 and 4, in examples the first capacitance values ($C_{BFi}$) may follow a quadratic function, or another function which is between a cubic function and a proportional function, at least over a majority of half of the ballasting capacitor units. The second capacitance values (e.g. $C_{BF2}+C_{BS2}$) may follow a quadratic function or another function which is between a cubic function and a proportional function at least over a majority of half of the ballasting capacitor units (or even over a majority of the ballasting capacitor units).

If the high RF voltage terminal is the terminal 104 ($RF_1$), a preferable configuration for the capacitance of the ballasting capacitor units ($C_{Bi}$) may be described by a (monotonically or strictly monotonically) descending curve 302, e.g., such that $C_{Bi}<C_{B(i+1)}$, $1 \le i \le N$. The descending curve 302 may be formed: by a first descending semi-curve 302a at a first group 130 of ballasting capacitor units (e.g., the first half of the switch units 102, i.e., $M_1 \ldots M_{N/2}$), so that the capacitances ($C_{Bi}$) of the ballasting capacitor units of the first group 130 is the second (larger) capacitance value (e.g., $C_{BFi}+C_{BSi}$); by a second descending semi-curve 302b at a second group 132 of ballasting capacitor units (e.g., the second half of the switch units, i.e., $M_{(N/2+1)} \ldots M_N$), so that the capacitance ($C_{Bi}$) of the ballasting capacitor units of the second group 132 is the first (smaller) capacitance value (e.g., $C_{BFi}$).

If the high RF voltage terminal is the terminal 106 ($RF_2$), a preferable configuration for the capacitance of the ballasting capacitor units ($C_{Bi}$) may be described by a (monotonically or strictly monotonically) ascending curve 304, e.g., such that $C_{Bi}>C_{B(i+1)}$, $1 \le i \le N$. The ascending curve 304 may be formed: by a first ascending semi-curve 304a at a first group 130 of ballasting capacitor units (e.g., the first half of the switch units, i.e., $M_1 \ldots M_{N/2}$), so that the capacitances ($C_{Bi}$) of the ballasting capacitor units of the first group 130 is the first (smaller) capacitance value (e.g., $C_{BFi}$); by a second ascending semi-curve 304b at a second group 132 of ballasting capacitor units (e.g., the second half of the switch units, i.e., $M_{(N/2+1)} \ldots M_N$), so that the capacitances ($C_{Bi}$) of the ballasting capacitor units of the second group 132 is the second (larger) capacitance value (e.g., $C_{BFi}+C_{BSi}$).

In examples, the values of the first and second capacitance values are chosen so as to be symmetrical with respect to the middle of the switch device (e.g., between the $N^{th}$ and the $(N+1)^{th}$ switch unit 102).

If the capacitances ($C_{BFi}$) of the permanent capacitor element 202 ($C_{BSi}$) and the capacitances ($C_{BFi}$) of the selectable capacitor element 204 are opportunely chosen and the ballasting capacitor switch elements 206 are adequately controlled, it is therefore possible to obtain at least some of the configuration modes:

TABLE 1

| Mode | Ballasting switches $M_{B1} \ldots M_{B(N/2)}$ of the first group 130 | Ballasting switches $M_{B(N/2+1)} \ldots M_{BN}$ of the second group 132 | RF voltage at switch ports | Use purpose |
|---|---|---|---|---|
| 1 | ON state ($C_{Bi} = C_{BFi} + C_{BSi}$) | OFF state ($C_{Bi} = C_{BFi}$) | $V_{RF1} > V_{RF2}$ | Voltage at $RF_1$ is known to be larger than voltage at $RF_2$: descending curve 302 |
| 2 | OFF state ($C_{Bi} = C_{BFi}$) | ON state ($C_{Bi} = C_{BFi} + C_{BSi}$) | $V_{RF1} < V_{RF2}$ | Voltage at $RF_1$ is known to be smaller than voltage at $RF_2$. Ascending curve 304 |
| 3 | ON state ($C_{Bi} = C_{BFi} + C_{BSi}$) | ON state ($C_{Bi} = C_{BFi} + C_{BSi}$) | Any | Not know which port sees larger voltage. Can be used for feed point tuning. Concave curve formed by semi-curves 302a and 304b |
| 4 | OFF state ($C_{Bi} = C_{BFi}$) | OFF state ($C_{Bi} = C_{BFi}$) | Any | Low-voltage applications, lowest capacitance of the switch. Convex curve formed by semi-curves 204a and 304b |

Figure 5:
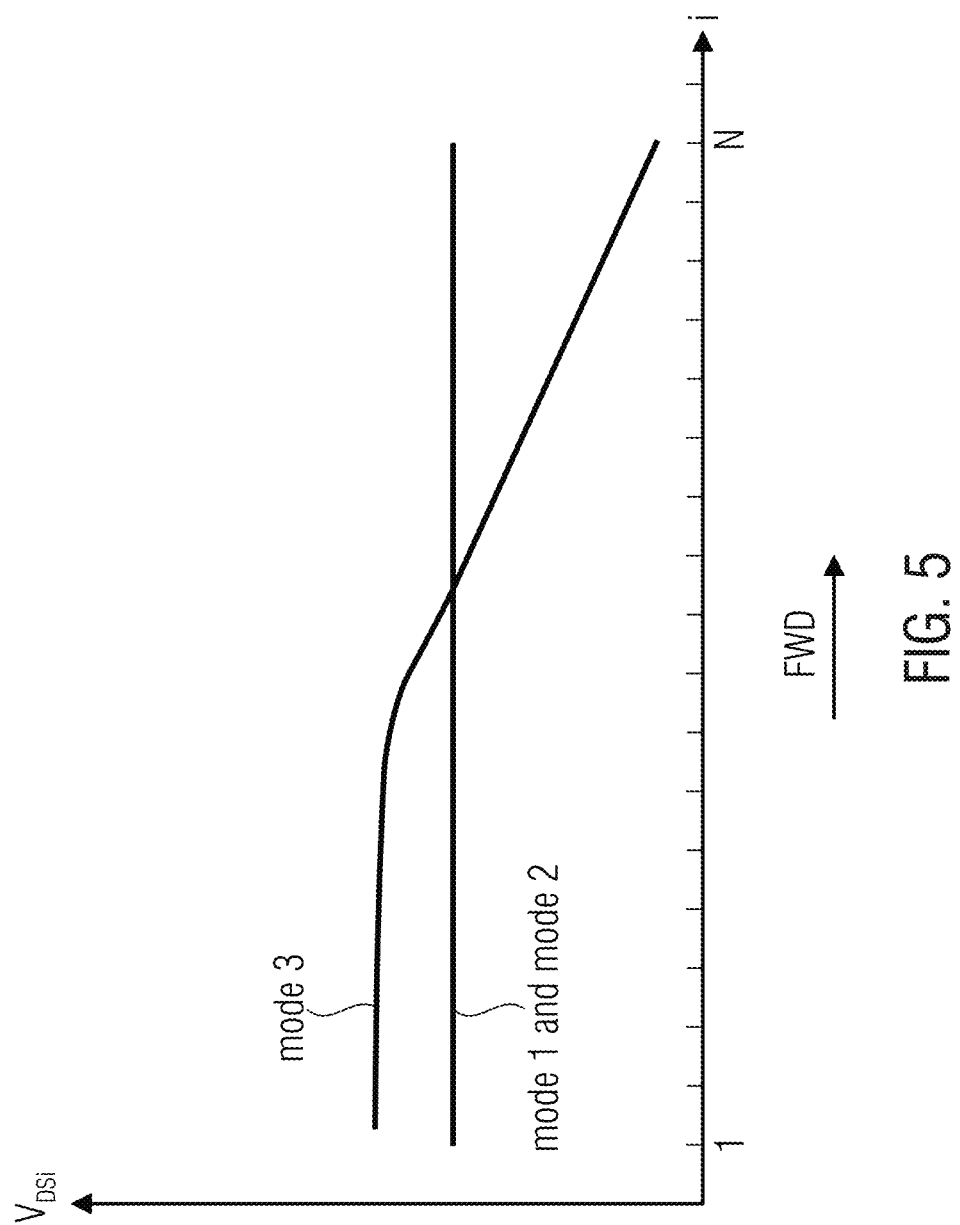
FIG. 5 shows a diagram representing voltages at switch units of the RF switch element.

FIG. 5 shows the amplitude of RF voltage (ordinate) between the drain terminal 110 and the source terminal 114 of at each switch unit 102 ($M_1 \ldots M_N$, abscissa) according to the different configuration modes. As can be seen with modes 1 and 2, the voltage is the same for each of the switch units 102.

Therefore, in modes 1 and 2, the parasitic capacitances are adequately compensated and the voltages are rendered uniform among the different switch units 102. Without the definition of the selectable capacitances of the ballasting capacitor switch elements, it would not be possible to permit both configuration mode 1 (for coping to the applications for which the high RF voltage terminal is the terminal 104) and configuration mode 2 (for coping to the applications for which the high RF voltage terminal is the terminal 106).

Figure 6:
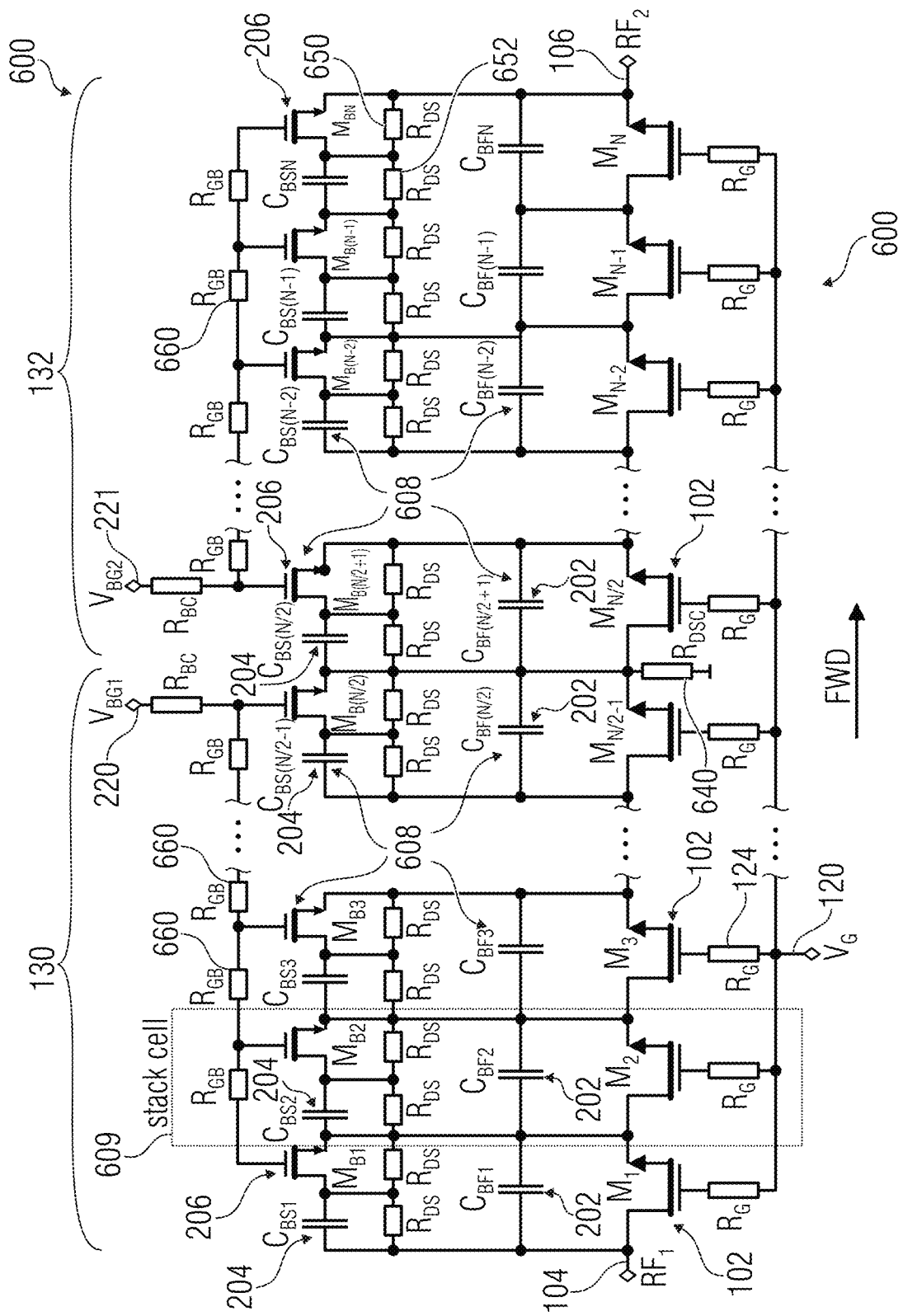
FIG. 6 shows an RF switch device.

FIG. 6 shows a variant 600 of the RF switch device 100. The RF switch device 600 may comprise (similarly to the device 100): a plurality of switch units 102 ($M_1-M_N$), coupled in series between a first series terminal 104 ($RF_1$)

and a second series terminal 106 (RF$_2$) to establish a switchable RF path; and a plurality of ballasting capacitor units 608 (C$_{B1}$–C$_{BN}$), each coupled in parallel to a respective switch unit 102 (M$_i$), to provide a selectable capacitance (e.g., between C$_{BFi}$ and C$_{BFi}$+C$_{BSi}$) in parallel to a signal path of the respective switch unit 102 (M$_i$).

The RF switch device 600 may be arranged in stacked cells 609. At least one of (or all) the ballasting capacitor units may be formed on a silicon-on-insulator, SOI, wafer. The RF switch device 600 may have a stacked structure.

Each ballasting capacitor unit 608 may comprise (similarly to the device 100): at least one permanent capacitor element 202 (C$_{BFi}$) which may be permanently in parallel to the signal path of the respective switch unit 102 (M$_i$); at least one selectable capacitor element 204 (C$_{BSi}$) which may be activated so as to be in parallel to the signal path of the respective switch unit 102 (M$_i$), so that the second capacitance value (C$_{BFi}$+C$_{BSi}$) is selected by activating the at least one selectable capacitor element 204; at least one ballasting capacitor switch unit 206 (e.g., a MOSFET) which may perform a selection between: a first, smaller capacitance value (C$_{BFi}$), e.g., by deactivating the selectable capacitor element 204; and a second, larger capacitance value (C$_{BFi}$+C$_{BSi}$), e.g., by activating the selectable capacitor element 204.

The RF switch device 600 may comprise high-ohmic resistors 650 (R$_{DS}$) connected to the terminals of each ballasting capacitor switch unit 206 (e.g., drain terminal and the source terminal). High-ohmic resistors 652 (R$_{DS}$) may also be connected at the terminals of the selectable capacitor element 204. Along a plurality of subsequent switch units 102, the succession of the resistors 650 and 652 may form a high-ohmic ladder tied to a DC bias (e.g., a commonly ground terminal) via a high-ohmic resistor 640 (R$_{DSC}$). Accordingly, DC bias voltage is provided to all the switch units 102 (e.g., at the source and drain of each MOSFET).

The ballasting capacitor switch unit 206 may be controlled by capacitance selection lines 220 and 221. E.g., capacitance selection line 220 may independently control the ballasting capacitor switch units 206 of the first group 130 of switch units M$_1$ . . . M$_{N/2}$, and the capacitance selection line 221 may independently control the ballasting capacitor switch units 206 of the second group 132 of switch units M$_{N/2}$ . . . M$_N$). In particular, voltages V$_{BG1}$ and V$_{BG2}$ (e.g., imposed by an external source) may control the gate terminals of the ballasting capacitor switch units 206. In the capacitance selection lines 220 and 221, high-ohmic resistors 660 may be inserted between gate terminals of consecutive switch units.

The gate control voltages V$_{BG1}$ and V$_{BG2}$ may be generated using, for example, one of the following techniques: discrete voltage levels V$_{low}$ and V$_{high}$ corresponding to OFF and ON state of the RF switch unit 102. Typical values for V$_{low}$ and V$_{high}$, may be −2.5 V and 2.5 V or −2V and 3 V or other values; V$_{BG1}$ and V$_{BG2}$ may be biased by voltages close to threshold voltage of the MOSFETs M$_{B1}$ . . . M$_{BN}$. In this way the resistance of the channel of transistors M$_{B1}$ . . . M$_{BN}$ may be gradually reduced if the drain/source operating point drifts down due to the influence of applied RF signal to the high-voltage RF switch (charging due to GIDL).

Gate control voltages V$_{BG1}$ and V$_{BG2}$ may be set independently from each other according to the operation modes described in Table 1.

Figure 7:
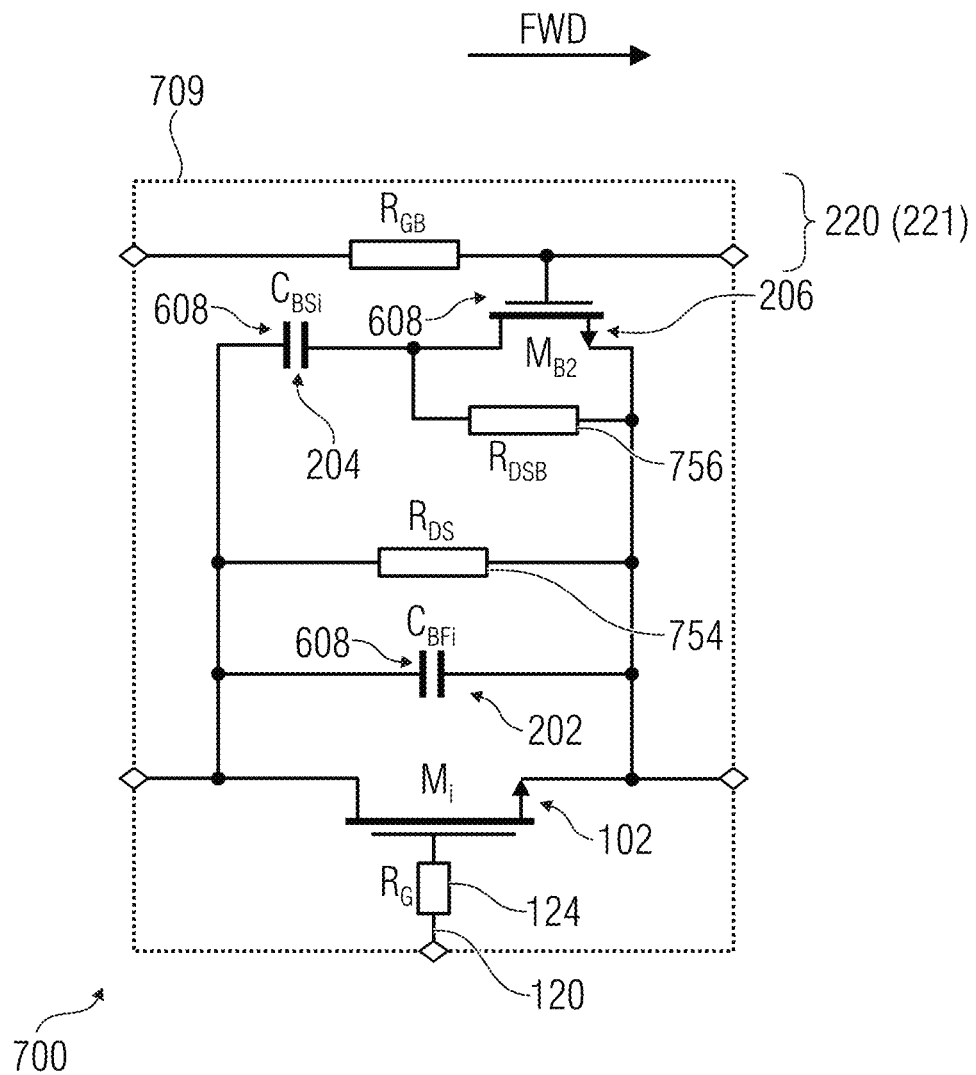
FIGS. 7 and 8 show elements of RF switch devices.

FIG. 7 shows another variant 700 (only a stacked cell 709 is shown, the cell 709 substituting the cells 609 of FIG. 6), with a ballasting capacitor unit 608 as in the example of FIG. 6. Here, while a high-ohmic resistor 756 (R$_{DSB}$) is connected to the terminals of the selectable capacitor element 204 (e.g., the drain terminal and the source terminal of the MOSFET 204), a high-ohmic resistor 754 (R$_{DS}$) is connected to the permanent capacitor element 202 (C$_{BFi}$), and also to the series formed by the selectable capacitor element 204 (in particular the source terminal) and the selectable capacitor element 204 (C$_{BFi}$).

Figure 8:
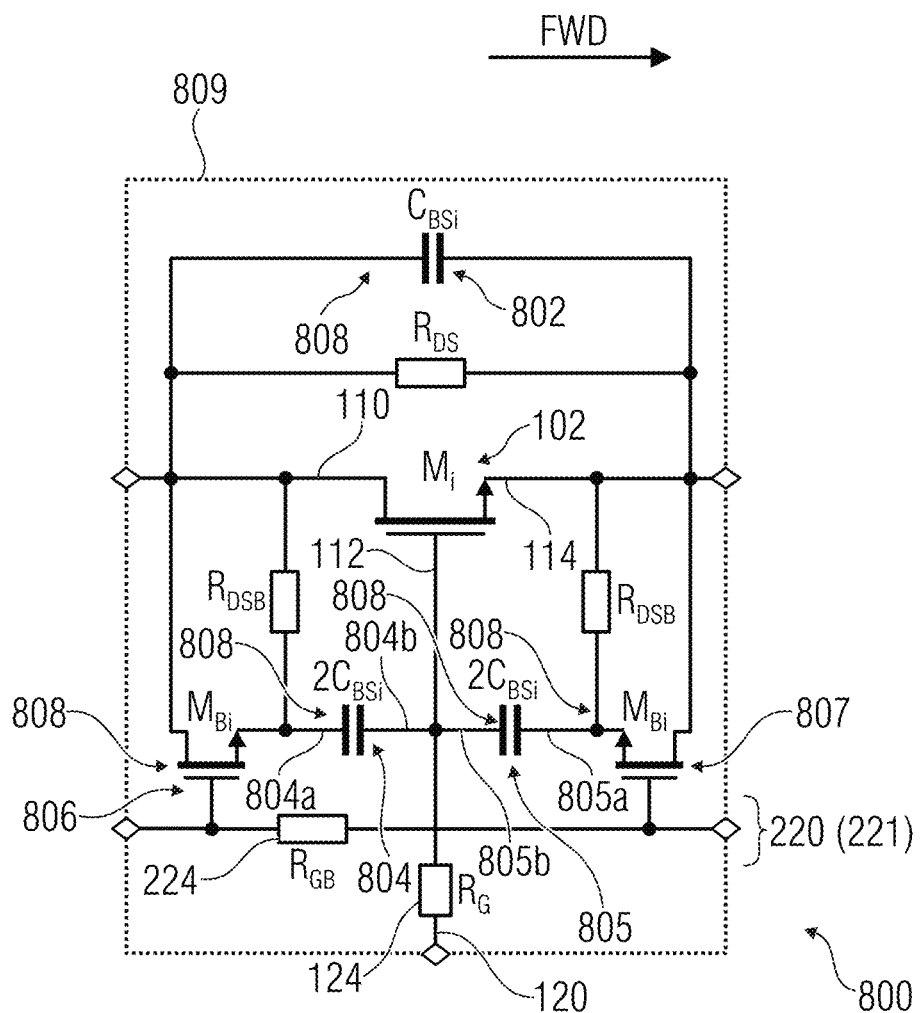

FIG. 8 shows another variant 800 (only a stacked cell 809 is shown, the cell 809 substituting the cells 609 of FIG. 6). Here, at least one ballasting capacitor unit 808 may include: at least one permanent capacitor element 802 (C$_{BFi}$) which may be permanently in parallel to the signal path of the switch unit 102 (M$_i$); a plurality of (e.g., a first and a second) selectable capacitor elements 804, 805; and a plurality of (e.g., a first and a second) ballasting capacitor switches 806, 807 (e.g., MOSFETs), e.g., for respectively activating and deactivating the selectable capacitor elements 804, 805.

The first selectable capacitor element 804 may have a first terminal 804a coupled with a terminal (e.g., drain terminal 110) of the switch unit 102 via the first ballasting capacitor switch 806. The second selectable capacitor element 805 may have a first terminal 805a coupled with a terminal (e.g., source terminal 114) of the switch unit 102 via the second ballasting capacitor switch 807.

A capacitance selection line 220 (221) may be configured to control the switch unit 102 (in case, with interposition of a resistor 224, R$_{GB}$). The capacitance selection line 220 (221) may be coupled to a second terminal 804b of the first selectable capacitor element 804 and to a second terminal of the second selectable capacitor element 805.

In this variant, due to series connection between the first and second ballasting capacitor switches 806 and 807, the value of each capacitor is doubled comparing to the implementations of FIGS. 6 and 7. Since each of the first and second ballasting capacitor switches 806 and 807 sees twice lower RF voltage than the implementations of FIGS. 6 and 7, thinner gate-oxide transistor may be used for this purpose. The examples above of may be operated, for example by: a first capacitance selection line 220, configured to control at least the majority of the ballasting capacitor switch elements (e.g., M$_{B1}$–M$_{B(N/2)}$) of a first group 130 of the ballasting capacitor units (108, 608, 708, 808); and a second capacitance selection line 221, configured to control at least the majority of the ballasting capacitor switch elements (e.g., M$_{B(N/2+1)}$–M$_{BN}$) of a second group 132 of the ballasting capacitor units (108, 608, 708, 808).

Accordingly, each group 130, 132 may be controlled to select the resistances shown in FIG. 3 and to operate according the configuration modes: first configuration mode (mode 1): the first control line 220 selects the second capacitance values (e.g., C$_{BFi}$+C$_{BSi}$) for at least the majority of the ballasting capacitors of the first group 130; and the second control line 221 selects the first capacitance values (e.g., C$_{BFi}$) for at least the majority of the ballasting capacitors of the second group 132; so that the capacitance values of at least the majority of the selected capacitances of the ballasting capacitor units decrease along the predetermined direction (the predetermined direction being from terminal 104 to terminal 106, as shown in FIG. 3); and/or second configuration mode (mode 2): the first control line 220 selects the first capacitance values (e.g., C$_{BFi}$) for at least the majority of the ballasting capacitors of the first group 130; and the second control line 221 selects the second capacitance values (e.g., C$_{BFi}$+C$_{BSi}$) for at least the majority of the ballasting capacitors of the second group 132; so that the capacitance values of at least the majority of the selected capacitances of the ballasting capacitor units increase along the predetermined direction; and/or third configuration mode (mode 3): the first control line 220 selects the second capacitance values (e.g., $C_{BFi}+C_{BSi}$) for at least the majority of the ballasting capacitors of the first group 130; and the second control line 221 selects the second capacitance values (e.g., $C_{BFi}+C_{BSi}$) for at least the majority of the ballasting capacitors of the second group 132; so that the capacitance values of at least the majority of the selected capacitances of the ballasting capacitor units decrease for a first portion and increase for a second portion, wherein the first portion precedes the second portion along the predetermined direction (e.g., concave curve formed by the semi-curves 302a and 304b in FIG. 3); and/or fourth configuration mode (mode 4): the first control line 220 selects the first capacitance values (e.g., $C_{BFi}$) for at least the majority of the ballasting capacitors of the first group 130; and the second control line 221 selects the first capacitance values (e.g., $C_{BFi}$) for at least the majority of the ballasting capacitors of the second group 132; so that the capacitance values of at least the majority of the selected capacitances of the ballasting capacitor units increase for a first portion and decrease for a second portion, wherein the first portion precedes the second portion along the predetermined direction (e.g., convex curve formed by the semi-curves 304a and 302b in FIG. 3).

Figure 9:
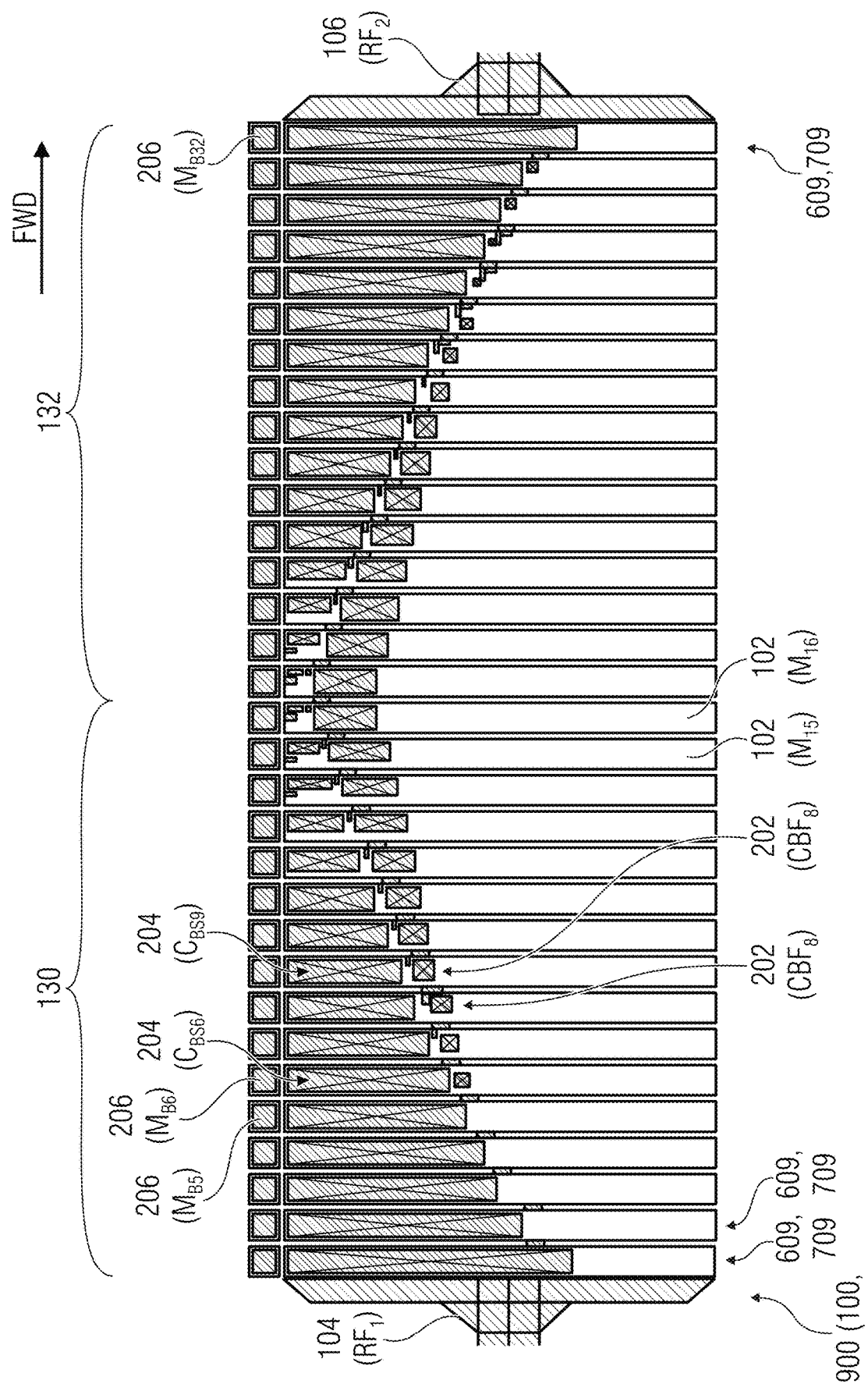
FIG. 9 shows a layout of an RF switch device.

FIG. 9 shows an example of a switch device 900 which may implement one of the examples (e.g., 100, 600, 700) discussed above. The switch device 900 may have a stacked structure. For example, the structure may be obtained as a stack of stack cells 609, 709, and 809. The stacked structure may comprise a fingered structure with switch units 102 ($M_i$), permanent capacitor elements 202 ($C_{BFi}$), selectable capacitor elements 204 ($C_{BSi}$), and ballasting capacitor switch elements 206 ($M_{Bi}$).

In a predetermined direction, i.e. from left to right (from terminal 104 to terminal 106), the permanent capacitor elements 202 ($C_{BF1} \ldots C_{BF16}$) of the first group 130 increase in dimensions (and in capacitance, as well), analogously to the semi-curve 304a of FIGS. 3 and 4. In the same predetermined direction, the dimensions (and capacitances) of the selectable capacitor elements 204 ($C_{BS1} \ldots C_{BS16}$) increase, as shown in FIG. 4. For the second group 132, the dimensions and capacitances follow the opposite trend. Hence, it is possible to select capacitances which, when composed to each other, may be decreasing (as in curve 302, configuration mode 1) or increasing (as in curve 304, mode 2).

Figure 10:
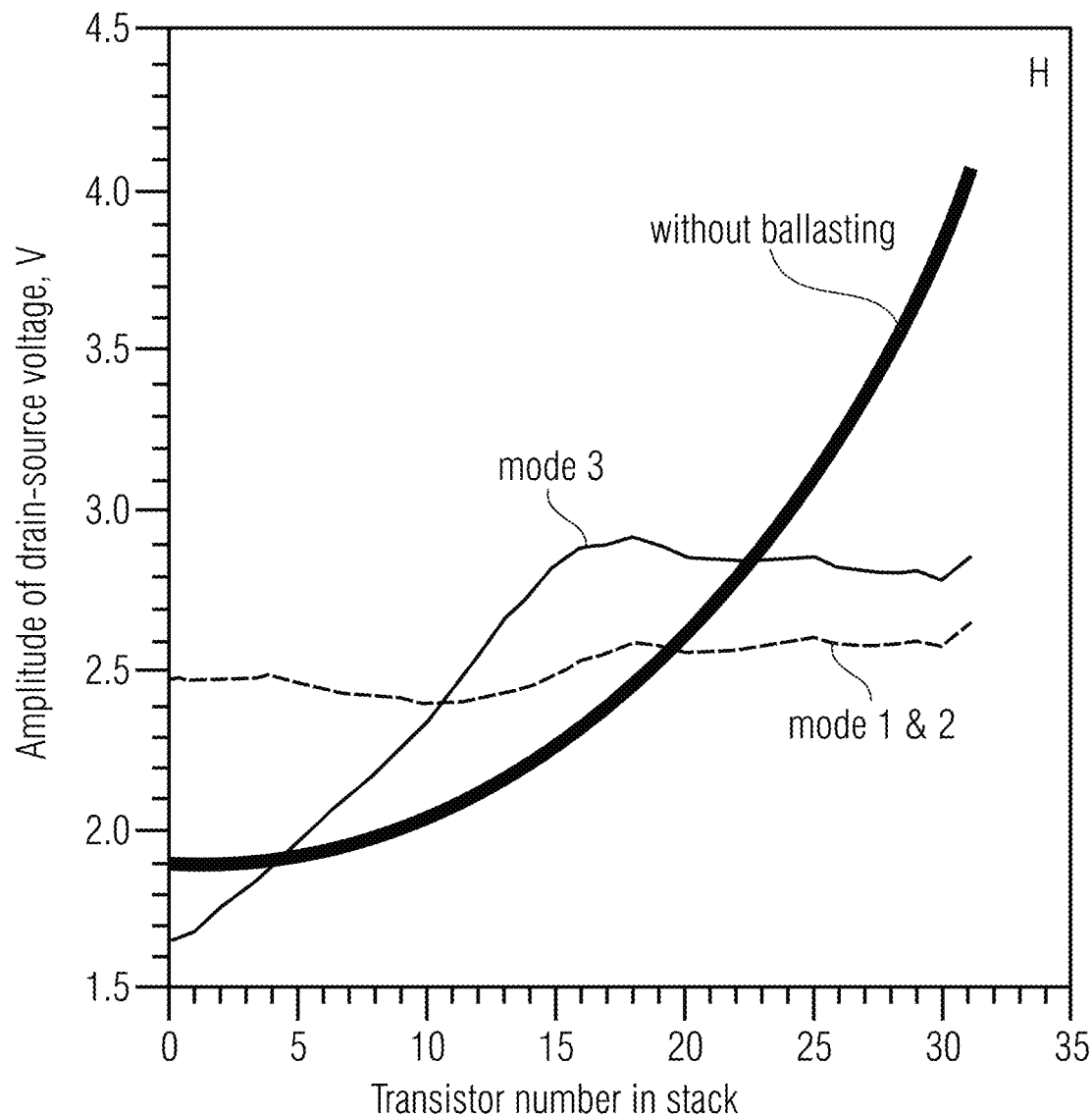
FIG. 10 shows a diagram representing voltages at switch units of the RF switch element.

A simulation on the switch device 900 (600) has been performed. In the simulation, the switch device 900 has been driven by an 80 V RF signal (or at least by an RF signal of more than 50 V). The amplitude of drain-source voltages at each transistor in the stack are plotted in FIG. 10. The voltage distribution in the un-ballasted switch is not uniform along the stack with maximum value reaching 4.1V. When the ballasting is enabled, according to mode 1 or mode 2 settings, the distribution is equalized at the level of approx. 2.5 V for all transistors in the stack. When the device 900 is operating in mode 3 with bipolar ballasting, then the peak voltage reaches the values of 2.9 V which is 0.4 V higher than in optimally-ballasted case (mode 1 or mode 2).

In examples, the capacitance values (e.g., $C_{BFi}$, $C_{BFi}+C_{BSi}$) may be chosen as preselections: if an application requires, for the first series terminal 104 ($RF_1$), a larger RF voltage than the RF voltage of the second terminal 106 ($RF_2$), the capacitances will be selected so as to be decreasing (e.g., configuration mode 1, following the descending curve 302 in FIG. 3), while the opposite (e.g., configuration mode 2, following the descending curve 304 in FIG. 3) will be selected in case an application requires a larger RF voltage for the second RF terminal 106 ($RF_2$) than for the first RF terminal 104 ($RF_2$).

In examples, a real-time control may be performed: a detector (not shown in FIGS. 1, 6, and 9) may detect the higher-voltage series terminal (between terminals 104 and 106) and switch the capacitances accordingly. For example, the capacitance selection lines 220 and 221 may be controlled in real time, so as to choose between: a descending order (configuration mode 1), when the detector detects that the RF voltage at the first series terminal 104 is larger than the RF voltage at the second series terminal 106; and an ascending order (configuration mode 2), when the detector detects that the RF voltage at the first series terminal 104 is smaller than the RF voltage at the second series terminal 106.

When the detector detects that the voltage is opposed, the order may be inverted in real time, simply by moving from the configuration mode 1 to the configuration mode 2, or vice versa.

Other kinds of detectors are also possible (e.g. detectors detecting the leakage current at the switch units 102, for example).

Figure 11:
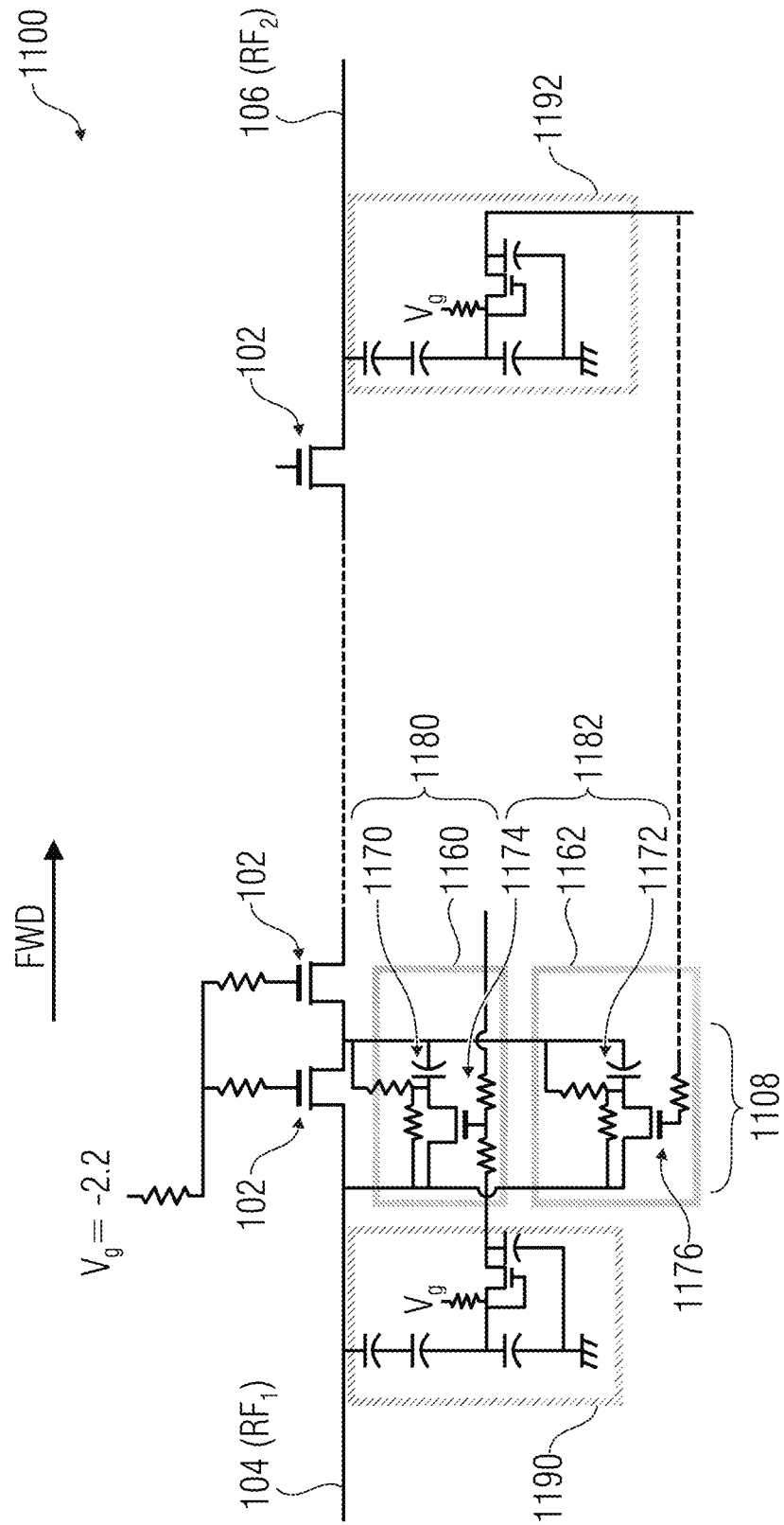
FIGS. 11-15 show examples of RF switch devices.
Figure 12:
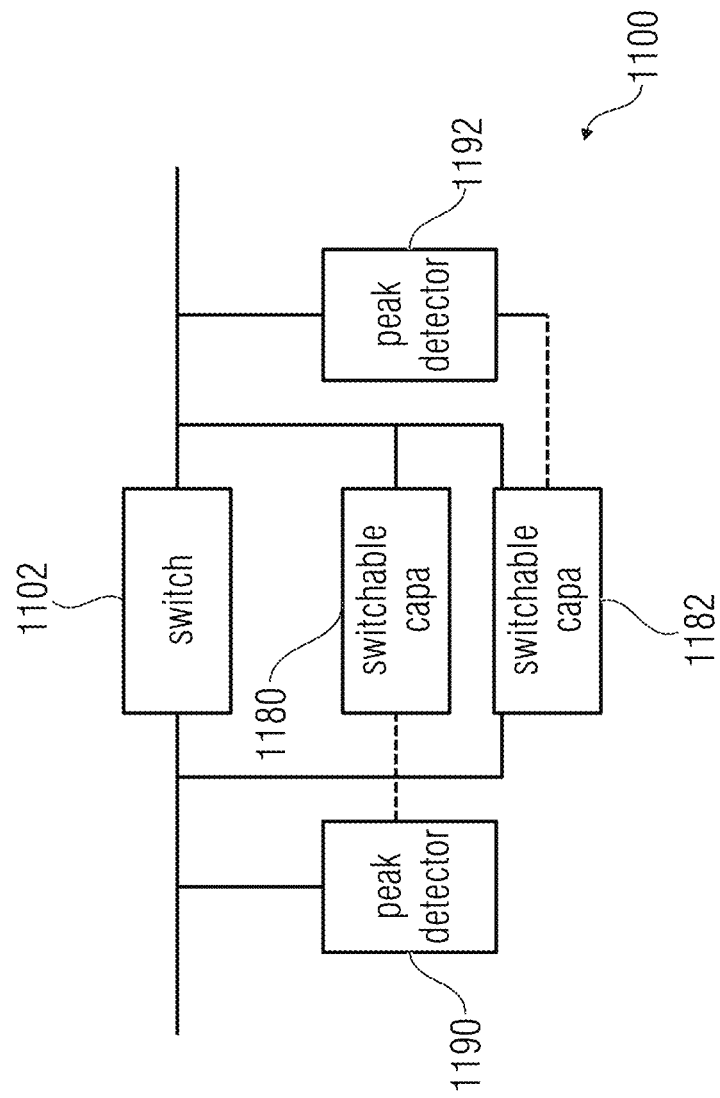
Figure 13:
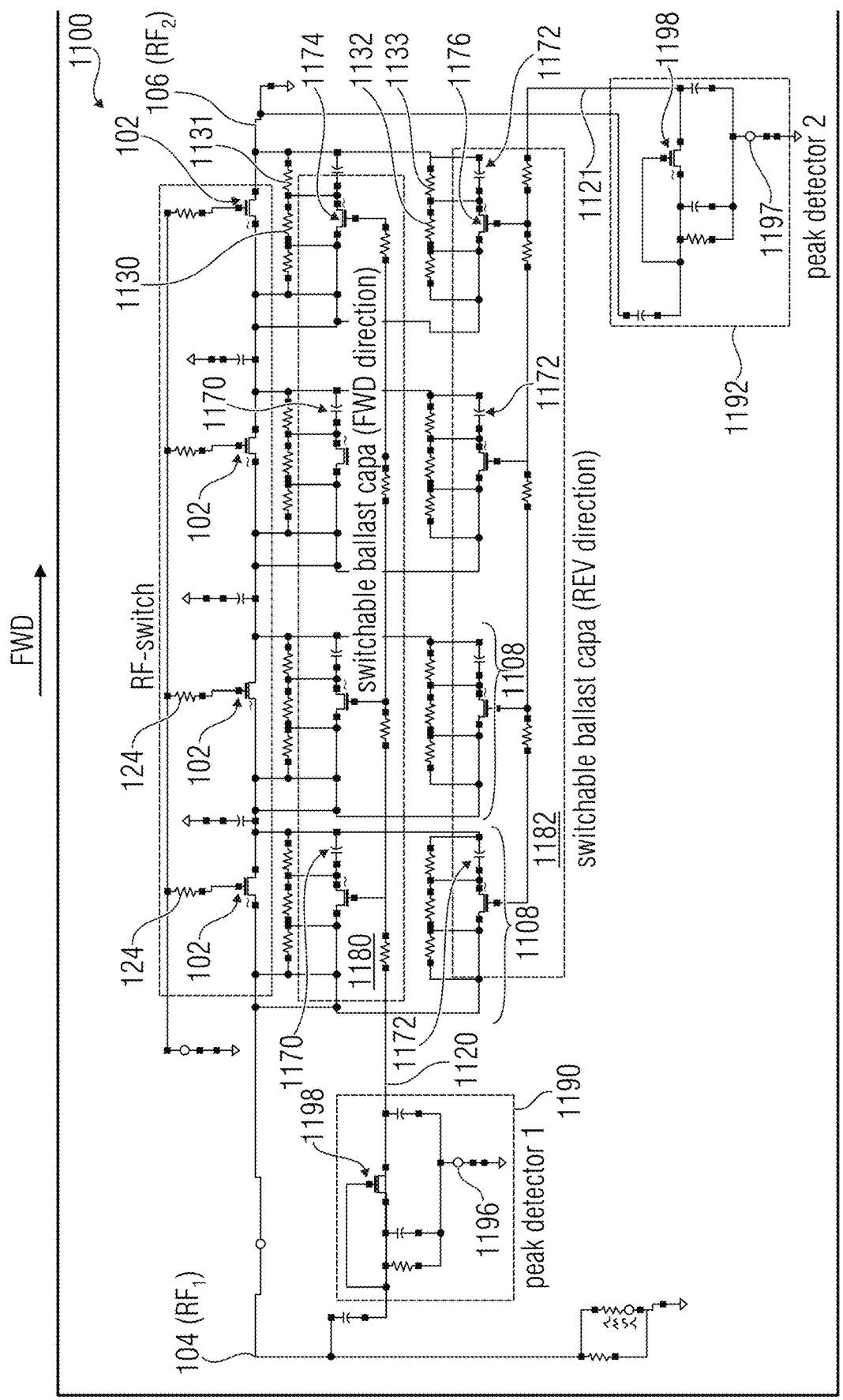

FIGS. 11, 12, and 13 refer to an example of an RF switch unit 1100. The RF switch unit 1100 comprises: a plurality of switch units 102 (e.g., forming a switch unit arrangement 1102), coupled in series between a first series terminal 104 ($RF_1$) and a second series terminal 106 ($RF_2$) to establish a switchable RF path; and a plurality of ballasting capacitor units 1108, each coupled in parallel to a respective switch unit 102, to provide a selectable capacitance in parallel to a signal path of the respective switch unit 102.

Each capacitor unit 1108 may comprise a first capacitor cell 1160 and a second capacitor cell 1162. Each of the first capacitor cell 1160 and the second capacitor cell 1162 may be modularly repeated (e.g., in a stacked arrangement) for at least the majority of (or all) the plurality of switch units 102.

Each capacitor unit 1108 may comprise a first capacitor element 1170 which may be activated, e.g., by a first switch element 1174 (which may be a MOSFET). Each capacitor unit 1108 may comprise a second capacitor element 1172 which may be activated, e.g., by a first switch element 1176 (which may be a MOSFET).

By activating and/or deactivating the capacitor unit 1108 and in particular the first capacitor elements 1170 and 1172 (e.g., by controlling the first and second switch elements 1174 and 1176), it is possible to select: a first capacitance value (e.g., provided by the first capacitor element 1174); and a second capacitance value (e.g., provided by the second capacitor element 1176).

At least for the majority of the capacitor units 1108, the first capacitance value is different from the second capacitance value, so as to permit the choice between a higher capacitance value and a lower capacitance value, and to permit the intended ballasting effect.

It is possible to define a first arrangement 1180 comprising at least the majority of (or all) the first capacitor elements 1170, and a second arrangement 1182 comprising at least the majority of (or all) the second capacitor elements 1172.

In examples, the capacitances of the first capacitor elements 1170 (first arrangement 1180 decrease along a predetermined direction (e.g., FWD direction in FIG. 13, i.e. from the first series terminal 104 to the second series terminal 106), e.g., to follow the curve 302 of FIG. 3. In examples, the capacitances of the second capacitor elements 1172 (second arrangement 1182) increase along the predetermined direction FWD (i.e. from the first series terminal 104 to the second series terminal 106), e.g., to follow the curve 304 of FIG. 3.

In examples, by selecting the first capacitances (e.g., by activating the first capacitor elements 1170 of the first arrangement 1180) for at least the majority of (or all) the capacitor units 1108, a configuration mode 1 (with descending capacitances) may be obtained, in particular when the higher RF voltage is at the first series terminal 104 ($RF_1$). By selecting the second capacitances (e.g., by activating the second capacitor elements 1172 of the second arrangement 1182) for at least the majority of (or all) the capacitor units 1108, a configuration mode 2 (with ascending capacitances) may be obtained, in particular when the higher RF voltage is at the second series terminal 106 ($RF_2$).

In some examples, the first capacitor elements 1170 are selected/deselected in alternative to the second capacitor elements 1172.

A first capacitance selection line 1120 may control the majority of (or all) first capacitor elements 1170 (e.g., by providing the necessary voltage at the gate terminal of each of the first switch elements 1174), while a second capacitance selection line 1121 may control the majority of (or all) second capacitor elements 1172 (e.g., by providing the necessary voltage at the gate terminal of each of the second switch elements 1176).

In examples, each capacitance selection line 1120, 1121 reaches each (or at least a majority) of the capacitor units 1108. This is different from the switch device 600, where the capacitance selection line 220 controls one single group (130 or 132).

The configuration modes may be based, for example, as pre-selections.

However, the RF switch device 1100 may perform a detection of the terminal experiencing the higher peak voltage between the terminals 104 and 106.

For example, a first voltage detector (e.g., a peak detector) 1190 may detect the RF voltage at the first series terminal 104 ($RF_1$). For example the first voltage detector 1190 may control the first switch elements 1174 of the first arrangement 1180 on the basis of the RF voltage at the first series terminal 104 ($RF_1$). A second voltage detector (e.g., a peak detector) 1192 may detect the RF voltage at the second series terminal 106 ($RF_2$). The second voltage detector 1192 may control the second switch elements 1176 of the second arrangement 1182 on the basis of the RF voltage at the first series terminal 104 ($RF_1$).

At least one of the first and second voltage detectors 1190 and 1192 may compare the voltage value of the respective series terminal (104 or 106) with a threshold value (respectively 1196 or 1197). For example, a MOSFET 1198 may be provided connected so that a high-voltage value is provided to the line 1120 or 1121 only when the voltage at the series terminal 104 or 106 is greater than the threshold 1196 or 1997.

Figure 14:
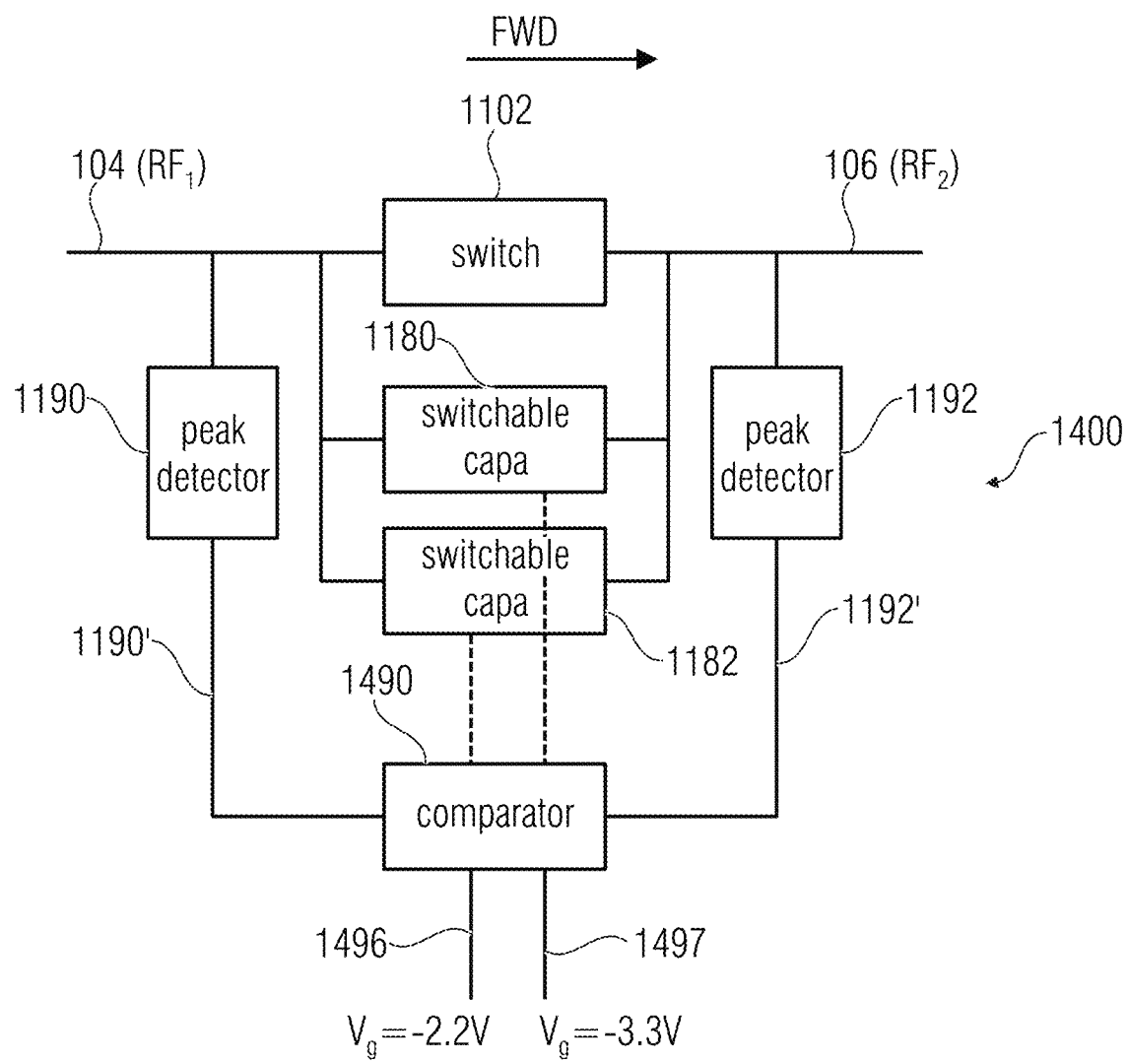

FIG. 14 shows a switch device 1400 which is distinguished from the switch device 1100 in that the two voltage detectors 1190, instead of directly controlling the first and second switch arrangements 118o and 1182, output the sensed voltage values 1990' and 1992' to a voltage comparator 1490, which controls the first and second arrangements 1180 and 1182 by comparing the sensed voltage values 1190' and 1192' with threshold values 1486 and 1497 (for example, the values may be −2.2 V and 3.3 V).

In examples, a detector may be configured to detect a leakage current or leakage voltage, such as the gate induced drain leakage, GIDL, current and/or a GIDL voltage associated to at least one of the plurality of switch units 102. Accordingly, it is possible to select the capacitance values of the ballasting capacitors based on the detected GIDL current and/or GIDL voltage. In addition or alternative, other leakage currents or leakage voltages, such as gate leakage currents or gate leakage voltages may be detected.

The detectors disclosed for the switch devices 1100 and 1400 above may be also used for the examples of FIGS. 1-10. In those cases, it is simply possible to control the capacitance selection lines 220 and 221 so as to obtain capacitance values which decrease from the higher-voltage terminal to the lower-voltage terminal.

In some examples, the activation of the first or second arrangements may be gradual, e.g., by gradually increasing or decreasing the voltage at the control lines 1220 and 1221. Alternatively, the voltage may be changed abruptly, so as to impulsively change the capacitance at all the capacitor units.

Figure 15:
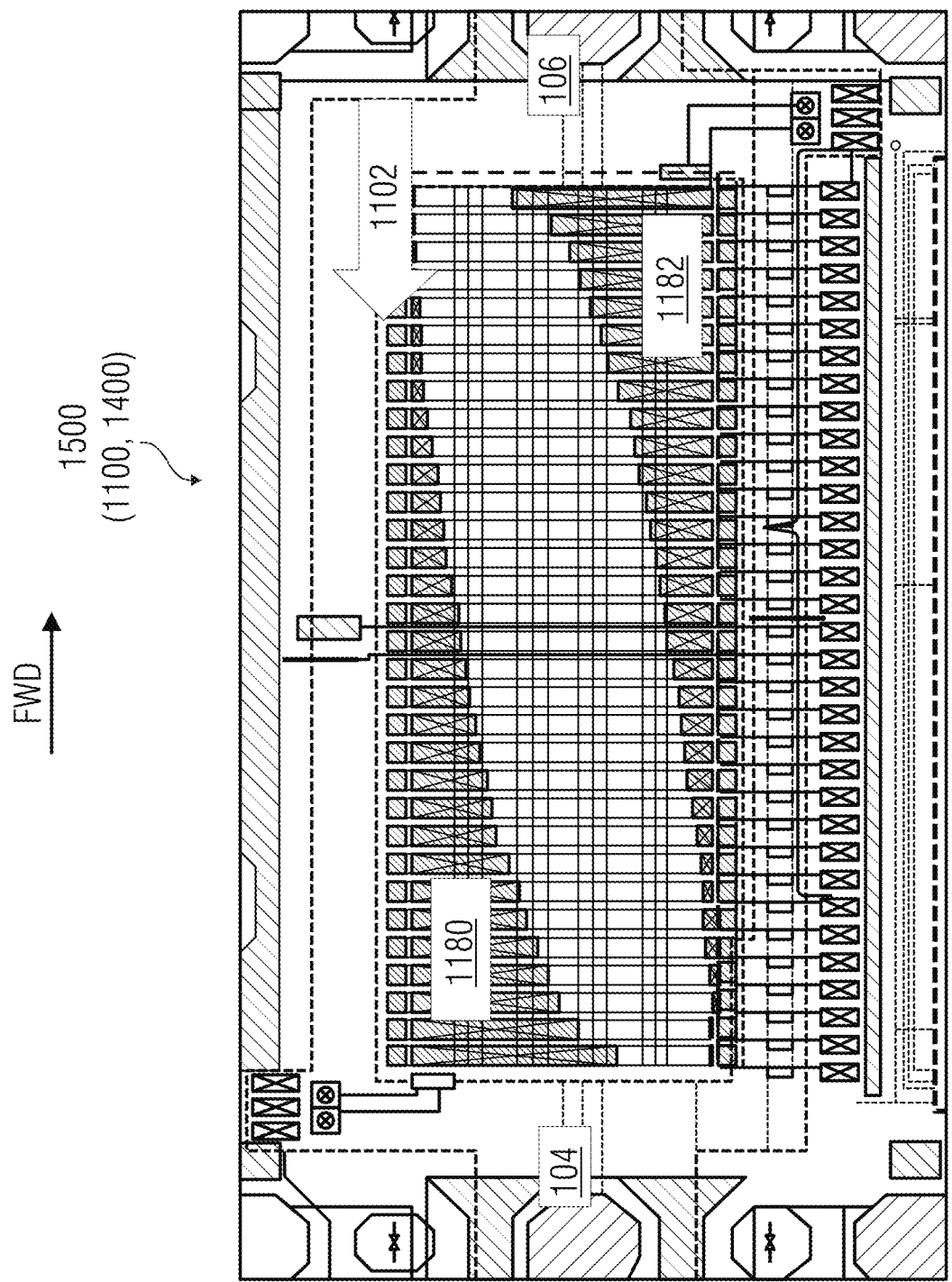

FIG. 15 shows a layout 1500 which may embody the RF switch devices 1100 or 1400. As may be seen, the capacitor units of the first arrangement 1180 decrease in dimensions (and in capacitance) along the predetermined direction from the first series terminal 104 to the second series terminal 106, while the capacitor units of the second arrangement 1182 increase in dimensions (and in capacitance) along the same predetermined direction.

In examples above, at least one of the capacitances and capacitor elements may be embodied, for example, by a varactor. At least one of the capacitances and capacitor elements may be embodied by a static capacitor. At least one of the capacitors may be a linear capacitor. At least one of the capacitors may be a MOS capacitor. At least one of the capacitors may be a (Metal-insulator-metal) MIM capacitor.

In examples above, the ballasting capacitor units may have a total series capacitance between 1 fF and 100 fF (femtofarads). At least one of the second capacitance values may be less than 1 pF.

In examples above, the capacitance values may be chosen so as to obtain: an equal distribution of voltages across the switching elements, within a tolerance of +/−20%, for a case in which a peak voltage at the first series terminal 104 is larger than a peak voltage at the second series terminal 106 in a first configuration state of the ballasting units; and an equal distribution of voltages across the switching elements, within a tolerance of +/−20%, for a case in which a peak voltage at the first series terminal 104 is smaller than a peak voltage at the second series terminal 106 in a second configuration state of the ballasting units.

It has been noted that it is also possible to compensate the GIDL induced bias shift by introducing a lower resistance. In particular, it is possible to configure a resistor unit in parallel to at least one of the plurality of switch units, wherein the resistor unit is selectable between: a first resistance value; and a second resistance value, wherein the second resistance value is larger than the first resistance value, wherein the RF switch device is configured to select at least one of: the first resistance value in correspondence with the selection of the first capacitance value; and the second resistance value in correspondence with the selection of the second capacitance value; and the first resistance value in correspondence with the selection of the first capacitance value.

In the examples of FIGS. 1-10, a low-resistance resistor (e.g., a resistor which GIDL induced voltage drop is lower than 1 mV, e.g., a resistor with resistance less than 10 KOHM, an in particular between 0.5 and 1.5 KOHM) may be selected in parallel to the selectable capacitance ($C_{Bsi}$).

An analogous effect may be obtained by opportunely configuring the resistors 1130, 1131, 1132, 1133 in FIG. 13. When the ballasting capacitor switch element 1174 is deactivated (OFF), the resistance in parallel to signal path of the MOSFET 102 (and to the GIDL) is the sum of the resistances of resistors 1130 and 1131. When the ballasting capacitor switch element 1174 is activated (ON), the resistance in parallel to the signal path of the MOSFET 102 is only the resistance of the resistor 1131 (as the resistor 1130 is shorted). The same applies to the resistors 1132 and 1133 with respect to the ballasting capacitor switch element 1176.

Figure 16:
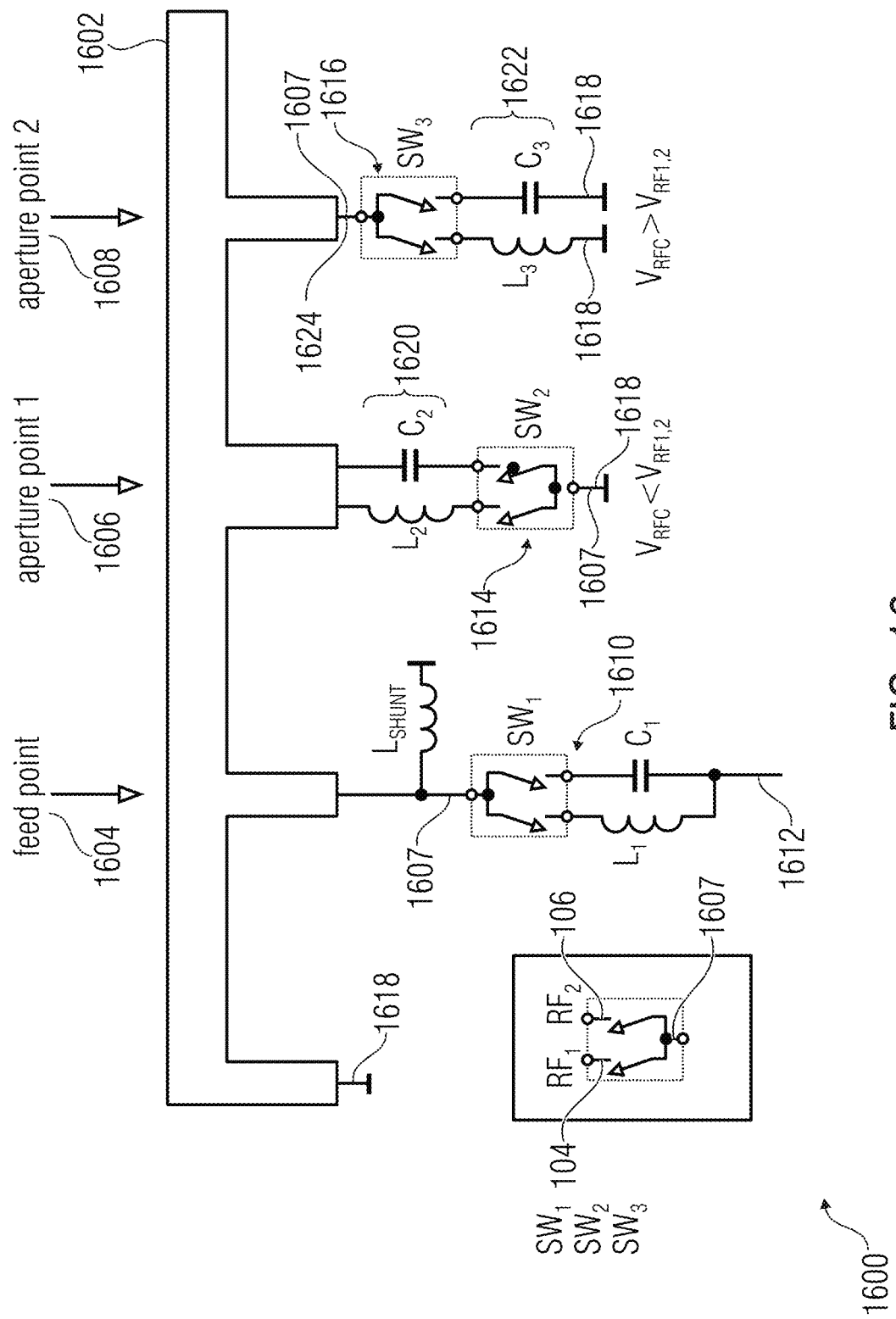
FIG. 16 shows an RF arrangement.

FIG. 16 shows an example, of radio frequency, RF, arrangement 1600, comprising: an antenna 1692 comprising a feed point 1604 and a tuning point (1606 or 1608), such as the aperture point 1 (1606) or the aperture point 2 (1608); a first radio frequency switch device 1610, e.g., according to one of the examples above (e.g., 100, 600, 700, 800, 900, 1100, 1400, 1500), wherein the first radio frequency switch device is coupled between a feed line 1612 and the feed point 1604; and a second radio frequency switch device (1614 or 1616), e.g., according to one of the examples above, wherein the second radio frequency switch device (1614 or 1616) is coupled between the tuning point (1606 or 1608) and a ground potential conductor 1618 in series with an impedance element (1620 or 1622).

Each of the RF switch devices 1610, 1614, 1616 may be according to any of the examples, shown in FIGS. 1-15. The RF switch devices 1610, 1614, 1616 may be placed between the first and second terminals 104 (RF$_1$) and 106 (RF$_2$) between: a closed position, so that the first and second terminals 104 (RF$_1$) and 106 (RF$_2$) are connected to each other and to a third terminal 1607 (RF$_C$); and an open position, so that the first and second terminals 104 (RF$_1$) and 106 (RF$_2$) are disconnected from each other and from the third terminal 1607 (RF$_C$).

The first radio frequency switch device 1610 may be configured to have a different distribution of ballasting capacitances along the plurality of switch units (e.g. a different distribution pattern) when compared to the second radio frequency switch device (1614 or 1616).

The switch elements of the switch devices may be implemented as stacked MOSFET devices (see above) on a silicon substrate (SOI or bulk CMOS). The applied RF voltage may be divided along the stack so that the voltage drop at each MOSFET in the stack does not exceed its breakdown and clipping voltage.

The parasitic capacitance between each node of the stack and the AC ground 1618 (i.e. substrate, ground metal lines etc.) would cause dis-balances in the voltage division along the stack, meaning that the transistors at hot side (higher peak RF voltage between the series terminals 104 and 106) of the RF switch device experiences a higher voltage drop than the transistors at cold side.

FIG. 16 shows the example of how a single pole dual throw switch (SPDT) may be used for tuning impedance and aperture of the compact antenna 1602: Aperture Point 1 (1606): the switch device 1614 is used in shunt configuration with a common pin 1607 shorted to ground 1618. In this use case the series terminals 104 (RF$_1$) and (RF$_2$) pins are exposed to higher RF voltage than RF$_C$ pin (connected to the feed point 1604).

Aperture Point 2 (1608): the switch device 1616 is used in shunt configuration with a common pin 1624 attached to aperture point 2 (1608). Depending on the values of components and operating frequency two cases may be considered: For the throw with inductor L$_3$, RF$_C$ terminal will be exposed to higher RF voltage than RF$_1$ port if operating frequency is below the resonance frequency of the tuning throw, namely:

$$f_{RF} < \frac{1}{2\pi\sqrt{L_3 C_{OFF}}}$$

where C$_{OFF}$ is the OFF capacitance of the throw. For example, if L$_3$=5 nH and C$_{OFF}$=150 fF, then the switch should ideally operate below 3 GHz to guarantee that RF$_C$ is exposed to higher voltage than RF$_1$.

For the throw with the capacitor C$_3$, RF$_C$ port will be exposed to higher RF voltage than RF$_1$ at any frequency if C$_3$>>C$_{OFF}$, where C$_{OFF}$ is the OFF capacitance of the throw. For example, 2 pF capacitor may be considered to be compliant with the condition C$_3$>>C$_{OFF}$.

Feed Point: the switch is operating in series mode and it is hard to predict which port of the switch is exposed to higher RF voltage. However, the RF voltage at antenna feed point is usually lower than the RF voltage at high-impedance aperture points.

It is beneficial for the product that the RF switch device is configured according to the use-case to achieve optimal RF voltage handling capabilities if operating conditions are predictable. One universal reconfigurable product can be deployed in different applications or use conditions.

According to embodiments, the invention may also be implemented by a method for operating an RF switch device (e.g., one of the RF switch devices as above) comprising a series coupling of switch elements. The method may comprise adjusting a distribution of capacitance values of ballasting capacitances, which are coupled in parallel to the switch elements, along the series of switch elements in dependence on a configuration information or in dependence on levels (e.g. peak levels) present at terminals of the switch elements.

Depending on certain implementation requirements, examples may be implemented in hardware. the implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

The above described examples are illustrative for the principles discussed above. It is understood that modifications and variations of the arrangements and the details described herein will be apparent. It is the intent, therefore, to be limited by the scope of the impending patent claims and not by the specific details presented by way of description and explanation of the examples herein.

What is claimed is:

1. A radio frequency, RF, switch device, wherein the RF switch device comprises:
    a plurality of switch units, wherein the plurality of switch units are coupled in series between a first series terminal and a second series terminal to establish a switchable RF path; and
    a plurality of ballasting capacitor units, wherein each ballasting capacitor unit of the plurality of ballasting capacitor units is coupled in parallel to a respective switch unit of the plurality of switch units, to provide a selectable capacitance in parallel to a signal path of the respective switch unit,
    wherein each ballasting capacitor unit comprises at least one ballasting capacitor switch element configured to switch the capacitance of the ballasting capacitor unit between:
    a first capacitance value; and
    a second capacitance value, wherein the second capacitance value is larger than the first capacitance value; and
    a first group of consecutive ballasting capacitor units such that the first capacitance values increase along a predetermined direction, while the second capacitance values decrease along the predetermined direction; and
    a second group of consecutive ballasting capacitor units such that the first capacitance values decrease along the predetermined direction, while the second capacitance values increase along the predetermined direction,
    wherein the first group precedes the second group along the predetermined direction and the first and second group together form at least a majority of the plurality of switch units of the switch device.

2. The RF switch device of claim 1, wherein the first capacitance value of a first ballasting capacitor unit of the plurality of ballasting capacitor units is different from the first capacitance value of a second ballasting capacitor unit of the plurality of ballasting capacitor units.

3. The RF switch device of claim 2, wherein the second capacitance value of the first ballasting capacitor unit is different from the second capacitance value of the second ballasting capacitor unit.

4. The RF switch device of claim 1, wherein at least one of the plurality of ballasting capacitor units comprises:
    at least one first capacitor element providing the first capacitance value; and
    at least one second capacitor element providing the second capacitance value,
    wherein the at least one ballasting capacitor switch element is configured to alternatively switch between:
    the at least one first capacitor element to select the first capacitance value; and
    the at least one second capacitor element to select the second capacitance value.

5. The RF switch device of claim 1, wherein at least one of the plurality of ballasting capacitor units comprises:
    at least one permanent capacitor element, wherein the at least one permanent capacitor element is permanently in parallel to the signal path of the respective switch unit;
    at least one selectable capacitor element, wherein the at least one selectable capacitor element is selectable to be in parallel to the signal path of the respective switch unit, so that the second capacitance value is selectable by activating the at least one selectable capacitor element,
    wherein the at least one ballasting capacitor switch element is configured to select:
    the first capacitance value by deactivating the at least one selectable capacitor element; and
    the second capacitance value by activating the at least one selectable capacitor element.

6. The RF switch device of claim 5, wherein:
    the at least one ballasting capacitor switch includes a first ballasting capacitor switch and a second ballasting capacitor switch; and
    the at least one selectable capacitor element includes:
    a first selectable capacitor element with a first terminal coupled with a first terminal of the respective switch unit via the first ballasting capacitor switch and a second selectable capacitor element with a first terminal coupled with a second terminal of the respective switch unit via the second ballasting capacitor switch;
    a capacitance selection line configured to control the respective switch unit, wherein the capacitance selection line is coupled to a second terminal of the first selectable capacitor element and to a second terminal of the second selectable capacitor element.

7. The RF switch device of claim 1, wherein the ballasting capacitor units are configured to have a total series capacitance between 1 fF and 100 fF, and/or wherein at least one of the second capacitance values is less than 1 pF.

8. The RF switch device of claim 1, wherein at least one of the ballasting capacitor units is formed on a silicon-on-insulator, SOT, wafer.

9. The RF switch device of claim 1, wherein the first capacitance values along the signal path or along the ballasting capacitor units or along a predetermined direction follow a quadratic function at least over a majority of half of the ballasting capacitor units, and/or wherein the second capacitance values along the signal path or along the ballasting capacitor units or along the predetermined direction follow a quadratic function or another function which is between a cubic function and a proportional function at least over the majority of half of the ballasting capacitor units.

10. The RF switch device of claim 1, wherein the first capacitance values and the second capacitance values of at least a majority of the ballasting capacitor units are arranged to permit a control that defines at least one of:

a first configuration mode, in which the capacitance values of at least the majority of the selected capacitances of the ballasting capacitor units decrease along a predetermined direction;

a second configuration mode, in which the capacitance values of at least the majority of the selected capacitances of the ballasting capacitor units increase along the predetermined direction of the signal path;

a third configuration mode, in which:

the capacitance values of at least the majority of the selected capacitances of a first group of ballasting capacitor units decrease along the predetermined direction; and the capacitance values of at least the majority of the selected capacitances of a second group of ballasting capacitor units increase along the predetermined direction, wherein the first group precedes the second group along the predetermined direction; and a fourth configuration mode, in which:

the capacitance values of at least the majority of the selected capacitances of a first group of ballasting capacitor units increase along the predetermined direction; and the capacitance values of at least the majority of the selected capacitances of a second group of ballasting capacitor units decrease along the predetermined direction, wherein the first group precedes the second group along the predetermined direction.

11. The RF switch device of claim 1, wherein the RF switch device comprises:

a first capacitance selection line, wherein the first capacitance selection line is configured to control at least a majority of the ballasting capacitor switch elements of a first group of the ballasting capacitor units; and a second capacitance selection line, wherein the second capacitance selection line is configured to control at least the majority of the ballasting capacitor switch elements of a second group of the ballasting capacitor units, wherein the first group precedes the second group along a predetermined direction, so that the RF switch device is configured to exert a control such that at least one of the following conditions is satisfied:

in a first configuration mode:

the first capacitance selection line selects the second capacitance values for at least the majority of the ballasting capacitors of the first group; and the second capacitance selection line selects the first capacitance values for at least the majority of the ballasting capacitors of the second group;

so that the capacitance values of at least the majority of the selected capacitances of the ballasting capacitor units decrease along the predetermined direction;

in a second configuration mode:

the first capacitance selection line selects the first capacitance values for at least the majority of the ballasting capacitors of the first group; and the second capacitance selection line selects the second capacitance values for at least the majority of the ballasting capacitors of the second group;

so that the capacitance values of at least the majority of the selected capacitances of the ballasting capacitor units increase along the predetermined direction;

in a third configuration mode:

the first capacitance selection line selects the second capacitance values for at least the majority of the ballasting capacitors of the first group; and the second capacitance selection line selects the second capacitance values for at least the majority of the ballasting capacitors of the second group;

so that the capacitance values of at least the majority of the selected capacitances of the ballasting capacitor units decrease for a first portion and increase for a second portion, wherein the first portion precedes the second portion along the predetermined direction;

in a fourth configuration mode:

the first capacitance selection line selects the first capacitance values for at least the majority of the ballasting capacitors of the first group; and the second capacitance selection line selects the first capacitance values for at least the majority of the ballasting capacitors of the second group;

so that the capacitance values of at least the majority of the selected capacitances of the ballasting capacitor units increase for a first portion and decrease for a second portion, wherein the first portion precedes the second portion along the predetermined direction.

12. The RF switch device of claim 1, wherein the RF switch device comprises:

a first capacitance selection line, wherein the first capacitance selection line is configured to control a first arrangement of capacitor elements associated to at least a majority of the ballasting capacitor units, wherein the capacitances of at least the majority of the capacitor elements of the first arrangement decrease along a predetermined direction of the RF path; and a second capacitance selection line, wherein the second capacitance selection line is configured to control a second arrangement of capacitor elements associated to at least the majority of the ballasting capacitor units, wherein the capacitances of at least the majority of the capacitor elements of the second arrangement decrease along the predetermined direction of the RF path, wherein the capacitor elements of the first arrangement are selectable and the capacitor elements of the second arrangement are selectable, wherein the RF switch device is configured to exert a control such that at least one of the following conditions is satisfied:

in a first configuration mode, the first capacitance selection line selects the capacitance values of the first arrangement, so that the capacitance values of the second arrangement are deactivated; and in a second configuration mode, the second capacitance selection line selects the capacitance values of the second arrangement, so that the capacitance values of the first arrangement are deactivated.

13. The RF switch device of claim 1, wherein the RF switch is configured to determine, between the first series terminal and the second series terminal, the terminal experiencing a higher peak voltage, to select the capacitance value of a determined ballasting capacitor unit to be higher than the capacitance value of a subsequent ballasting capacitor unit, wherein the determined ballasting capacitor unit is closer to a voltage terminal at higher voltage than the subsequent ballasting capacitor unit.

14. The RF switch device of claim 1, wherein the RF switch is configured to determine, between the first series terminal and/or the second series terminal, the terminal experiencing a higher peak voltage,
to select capacitances of the ballasting capacitor units such that ballasting capacitance values are monotonically or strictly monotonically decreasing when proceeding along the switch units from the series terminal experiencing the higher peak voltage towards the other series terminal.

15. The RF switch device of claim 1, wherein the RF switch device is configured to detect at least one of a gate induced drain leakage, GIDL, current and a GIDL voltage associated to at least one of the plurality of switch units, or a gate leakage current or gate leakage voltage or another leakage current or another leakage voltage, to select the capacitance values of the ballasting capacitors based on the detected leakage current or leakage voltage.

16. The RF switch device of claim 1, wherein the RF switch device is configured to use at least one of a gate induced drain leakage, GIDL, current and a GIDL voltage to detect at least one of a peak in the voltage or to detect the terminal at higher voltage between the first series terminal or the second series terminal.

17. The RF switch device of claim 1, further comprising a resistor unit in parallel to at least one of the plurality of switch units, wherein the resistor unit is selectable between:
a first resistance value; and
a second resistance value, wherein the second resistance value is larger than the first resistance value,
wherein the RF switch device is configured to select at least one of:
the first resistance value in correspondence with the selection of the first capacitance value;
the second resistance value in correspondence with the selection of the second capacitance value; and
the first resistance value in correspondence with the selection of the first capacitance value.

18. The RF switch device of claim 1, further comprising a resistor unit in parallel to at least one of the plurality of switch units, wherein the resistor unit is modifiable according to at least a voltage level at the first series terminal and the second series terminal.

19. The RF switch device of claim 1, wherein the capacitance values are chosen in order to obtain an equal distribution of voltages across the switching elements, within a tolerance of +/−20%, for a case in which a peak voltage at the first series terminal is larger than a peak voltage at the second series terminal in a first configuration state of the ballasting units, and to obtain an equal distribution of voltages across the switching elements, within a tolerance of +/−20%, for a case in which a peak voltage at the first series terminal is smaller than a peak voltage at the second series terminal in a second configuration state of the ballasting units.

20. A radio frequency, RF, arrangement, comprising:
an antenna comprising a feed point and a tuning point;
a first radio frequency switch device according to claim 1, wherein the first radio frequency switch device is coupled between a feed line and the feed point; and
a second radio frequency switch device according to claim 1, wherein the second radio frequency switch device is coupled between the tuning point and a ground potential conductor in series with an impedance element,
wherein the first radio frequency switch device is configured to have a different distribution of ballasting capacitances along the plurality of switch units.

21. A method for operating an RF switch comprising a series coupling of switch elements, wherein the method comprises:
adjusting a distribution of capacitance values of ballasting capacitances, which are coupled in parallel to the switch elements, along the series of switch elements in dependence on a configuration information or in dependence on levels present at terminals of the switch elements;
determining, between a first series terminal and a second series terminal of the RF switch, the terminal experiencing a higher peak voltage; and
selecting the capacitance value of a determined ballasting capacitance to be higher than the capacitance value of a subsequent ballasting capacitance, wherein the determined ballasting capacitor unit is closer to a voltage terminal at higher voltage than the subsequent ballasting capacitor unit.

22. A radio frequency, RF, switch device, wherein the RF switch device comprises:
a plurality of switch units, wherein the plurality of switch units are coupled in series between a first series terminal and a second series terminal to establish a switchable RF path; and
a plurality of ballasting capacitor units, wherein each ballasting capacitor unit of the plurality of ballasting capacitor units is coupled in parallel to a respective switch unit of the plurality of switch units, to provide a selectable capacitance in parallel to a signal path of the respective switch unit,
wherein each ballasting capacitor unit comprises at least one ballasting capacitor switch element configured to switch the capacitance of the ballasting capacitor unit between:
a first capacitance value; and
a second capacitance value, wherein the second capacitance value is larger than the first capacitance value, and
wherein the RF switch is configured to determine, between the first series terminal and the second series terminal, the terminal experiencing a higher peak voltage,
to select the capacitance value of a determined ballasting capacitor unit to be higher than the capacitance value of a subsequent ballasting capacitor unit, wherein the determined ballasting capacitor unit is closer to a voltage terminal at higher voltage than the subsequent ballasting capacitor unit.

23. A radio frequency, RF, switch device, wherein the RF switch device comprises:
a plurality of switch units, wherein the plurality of switch units are coupled in series between a first series terminal and a second series terminal to establish a switchable RF path; and
a plurality of ballasting capacitor units, wherein each ballasting capacitor unit of the plurality of ballasting capacitor units is coupled in parallel to a respective switch unit of the plurality of switch units, to provide a selectable capacitance in parallel to a signal path of the respective switch unit, wherein each ballasting capacitor unit comprises at least one ballasting capacitor switch element configured to switch the capacitance of the ballasting capacitor unit between:

a first capacitance value; and a second capacitance value, wherein the second capacitance value is larger than the first capacitance value, and wherein the RF switch device is configured to detect at least one of a gate induced drain leakage, GIDL, current and a GIDL voltage associated to at least one of the plurality of switch units, or a gate leakage current or gate leakage voltage or another leakage current or another leakage voltage, to select the capacitance values of the ballasting capacitors based on the detected leakage current or leakage voltage.

24. A radio frequency, RF, arrangement, comprising:

an antenna comprising a feed point and a tuning point;

a first radio frequency switch device, wherein the first radio frequency switch device is coupled between a feed line and the feed point; and a second radio frequency switch device, wherein the second radio frequency switch device is coupled between the tuning point and a ground potential conductor in series with an impedance element, wherein the first radio frequency switch device and the second radio frequency switch each comprise:

a plurality of switch units, wherein the plurality of switch units are coupled in series between a first series terminal and a second series terminal to establish a switchable RF path; and a plurality of ballasting capacitor units, wherein each ballasting capacitor unit of the plurality of ballasting capacitor units is coupled in parallel to a respective switch unit of the plurality of switch units, to provide a selectable capacitance in parallel to a signal path of the respective switch unit, wherein each ballasting capacitor unit comprises at least one ballasting capacitor switch element configured to switch the capacitance of the ballasting capacitor unit between:

a first capacitance value; and a second capacitance value, wherein the second capacitance value is larger than the first capacitance value, and wherein the first radio frequency switch device is configured to have a different distribution of ballasting capacitances along the plurality of switch units.

25. A method for operating an RF switch comprising a series coupling of switch elements, wherein the method comprises:

adjusting a distribution of capacitance values of ballasting capacitances, which are coupled in parallel to the switch elements, along the series of switch elements in dependence on a configuration information or in dependence on levels present at terminals of the switch elements; and detecting at least one of a gate induced drain leakage, GIDL, current and a GIDL voltage associated to at least one of the series coupling of switch elements, or a gate leakage current or gate leakage voltage or another leakage current or another leakage voltage, to select the capacitance values of the ballasting capacitances based on the detected leakage current or detected leakage voltage.

* * * * *

UNITED STATES PATENT AND TRADEMARK OFFICE
CERTIFICATE OF CORRECTION

PATENT NO. : 10,734,987 B2
APPLICATION NO. : 16/506343
DATED : August 4, 2020
INVENTOR(S) : Solomko et al.

It is certified that error appears in the above-identified patent and that said Letters Patent is hereby corrected as shown below:

In the Claims

In Column 20, Line 64, Claim 8, delete "SOT" and insert --SOI--.

Signed and Sealed this
Tenth Day of November, 2020

Andrei Iancu
*Director of the United States Patent and Trademark Office*